(12) United States Patent
Bharath et al.

(10) Patent No.: US 12,336,196 B2
(45) Date of Patent: Jun. 17, 2025

(54) MAGNETIC CORE INDUCTORS ON PACKAGE SUBSTRATES

(71) Applicant: Intel Corporation, Chandler, AZ (US)

(72) Inventors: Krishna Bharath, Chandler, AZ (US);
Wei-Lun Jen, Chandler, AZ (US);
Huong Do, Chandler, AZ (US);
Amruthavalli Alur, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1367 days.

(21) Appl. No.: 16/107,778

(22) Filed: Aug. 21, 2018

(65) Prior Publication Data
US 2020/0066830 A1    Feb. 27, 2020

(51) Int. Cl.
| H01L 23/522 | (2006.01) |
| H01F 17/00 | (2006.01) |
| H01F 27/26 | (2006.01) |
| H01L 23/00 | (2006.01) |
| H01L 23/64 | (2006.01) |
| H10D 1/20 | (2025.01) |
| H01F 17/04 | (2006.01) |

(52) U.S. Cl.
CPC ........... *H10D 1/20* (2025.01); *H01F 17/0033* (2013.01); *H01F 27/266* (2013.01); *H01L 23/5226* (2013.01); *H01L 23/5227* (2013.01); *H01L 23/645* (2013.01); *H01L 24/03* (2013.01); *H01L 24/09* (2013.01); *H01F 2017/0086* (2013.01)

(58) Field of Classification Search
CPC ... H01L 28/10; H01L 23/5227; H01L 23/645; H01L 2924/19042; H01L 25/0657; H01L 25/043; H01L 25/074; H01L 25/0756; H01L 25/117; H01L 2224/08145; H01L 2224/023–024; H01L 2224/0235; H01L 2224/02372; H01L 2224/02373; H01L 23/49822; H01L 23/5383; H01F 17/0006–17/0033; H01F 2017/002; H01F 2017/004–0086; H01F 2017/046; H01F 2017/065; H01F 41/041–042; H01F 41/046; H01F 17/04–08; H10D 1/20
See application file for complete search history.

(56) References Cited

U.S. PATENT DOCUMENTS

| 2007/0257761 A1* | 11/2007 | Mano | H01F 17/06 336/200 |
| 2010/0163295 A1* | 7/2010 | Roy | H01L 21/76877 174/262 |
| 2011/0204472 A1* | 8/2011 | Pagaila | H01L 24/20 257/528 |

(Continued)

*Primary Examiner* — Younes Boulghassoul
*Assistant Examiner* — Quinton A Brasfield
(74) *Attorney, Agent, or Firm* — Essential Patents Group, LLP

(57) ABSTRACT

A microelectronics package comprises a substrate comprising at least two conductive layers that are separated by a first dielectric. At least one island comprising a magnetic material is embedded within the dielectric between the two conductive layers. An inductor structure extends within a via in the at least one island. The via extends between the two conductive layers. The inductor structure comprises a conductive wall along a sidewall of the via, and wherein the conductive wall surrounds a second dielectric and is electrically coupled to the two conductive layers.

20 Claims, 10 Drawing Sheets

(56) References Cited

U.S. PATENT DOCUMENTS

| | | | |
|---|---|---|---|
| 2013/0056847 A1* | 3/2013 | Chen | H01F 27/29 |
| | | | 257/E29.325 |
| 2014/0159851 A1* | 6/2014 | Mano | H01F 17/0013 |
| | | | 336/200 |
| 2015/0302974 A1* | 10/2015 | Zhao | H01F 41/046 |
| | | | 336/200 |
| 2015/0348695 A1* | 12/2015 | Kostelnik | H01F 41/046 |
| | | | 336/200 |
| 2016/0183361 A1* | 6/2016 | May | H01L 23/49866 |
| | | | 174/257 |
| 2017/0062120 A1* | 3/2017 | Yun | H01F 41/32 |
| 2017/0103946 A1* | 4/2017 | Chang | H01L 23/5223 |
| 2018/0197845 A1* | 7/2018 | Min | H01L 25/0657 |
| 2019/0287815 A1* | 9/2019 | Xu | H01F 41/24 |
| 2019/0385777 A1* | 12/2019 | Kodama | H01F 17/0013 |
| 2020/0006239 A1* | 1/2020 | Zhang | H10D 86/60 |
| 2020/0168384 A1* | 5/2020 | Zhao | H01F 17/0013 |

\* cited by examiner

MAGNETIC CORE INDUCTORS ON PACKAGE SUBSTRATES

BACKGROUND

Integrated voltage regulator (IVR) technology is an efficient die and package architecture for managing disparate voltages required by the various functions encompassed by a microprocessor. Currently, IVR implementations in microprocessor packages, such as fully-integrated voltage regulator (FIVR) topologies, rely on air-core inductors. Typically, the air-core inductors are off-die, either on, or embedded within, the package dielectric adjacent to the microprocessor die. Industry trends and market pressures are forcing chip manufacturers to reduce package footprint with succeeding microprocessor generations. Space for the embedded inductor is reduced as well, causing decreases in inductor performance. In particular, the successively more compact air-core inductors have inductances that diminish from generation to generation, resulting in declining quality factor (ratio of energy stored in the inductor's magnetic field to energy dissipated by resistive losses in the inductor windings). As a consequence, the overall efficiency of IVRs suffer as losses increase.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1:
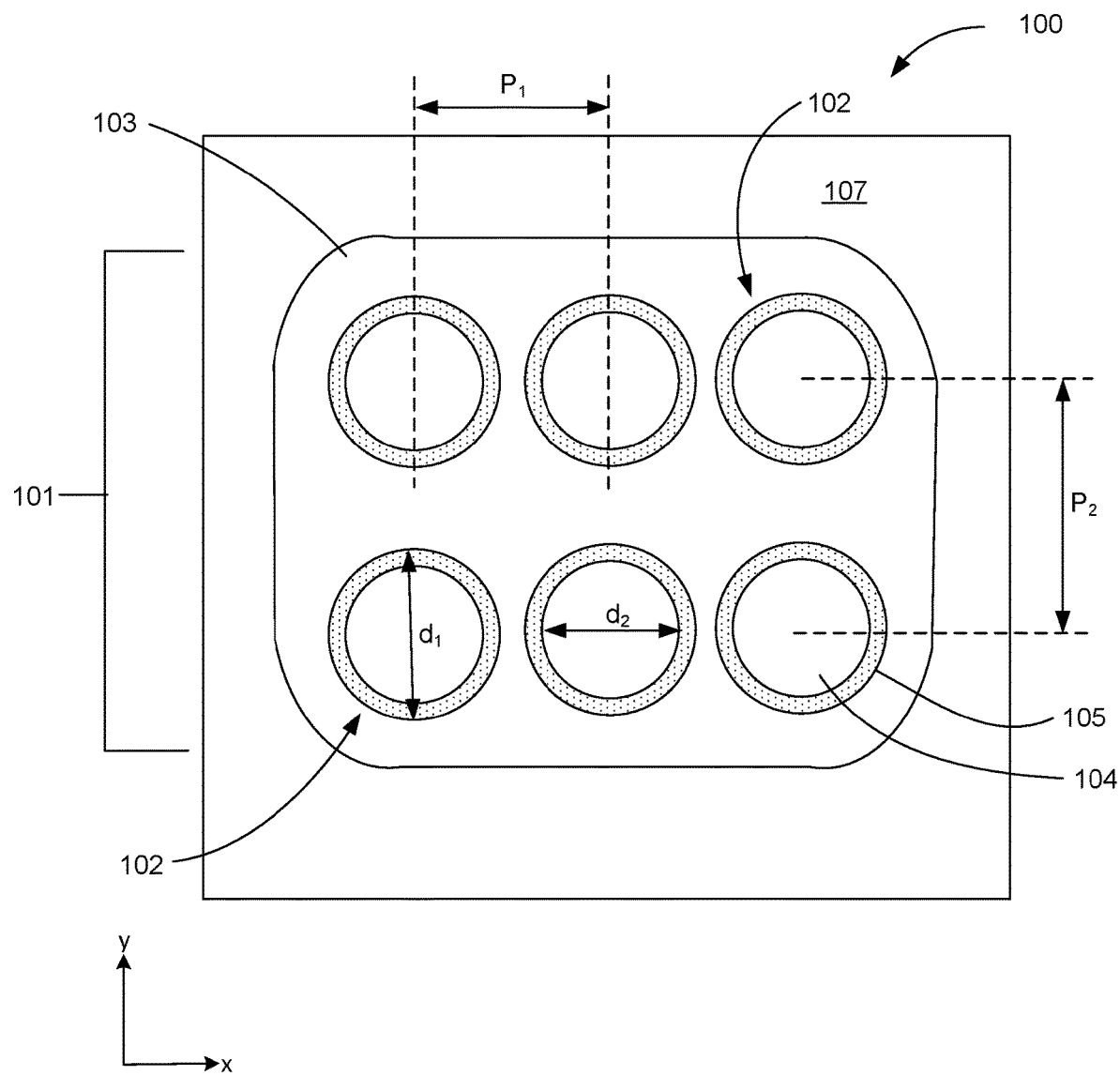
FIG. 1 illustrates a plan view of an integrated inductor unit using PTH (plated through-hole) vias in a trench magnetic core, according to embodiments of the disclosure.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Throughout the specification, and in the claims, the term "connected" or "interconnected" means a direct connection, such as electrical, mechanical, or magnetic connection between the things that are connected, without any intermediary devices.

Here, the term "coupled" means a direct or indirect connection, such as a direct electrical, mechanical, or magnetic connection between the things that are connected or an indirect connection, through one or more passive or active intermediary devices.

Here, the term "package" generally refers to a self-contained carrier of one or more dies, where the dies are attached to the package substrate, and encapsulated for protection, with integrated or wire-boned interconnects between the die(s) and leads, pins or bumps located on the external portions of the package substrate. The package may contain a single die, or multiple dies, providing a specific function. The package is usually mounted on a printed circuit board for interconnection with other packaged ICs and discrete components, forming a larger circuit.

Here, the term "substrate" refers to the substrate of an IC package. The package substrate is generally coupled to the die or dies contained within the package, where the substrate comprises a dielectric having conductive structures on or embedded with the dielectric. Throughout this specification, the term "package substrate" is used to refer to the substrate of an IC package.

Here, the term "core" generally refers to a stiffening layer generally embedded within of the package substrate, or comprising the base of a package substrate. In many IC package architectures, a core may or may not be present within the package substrate. A package substrate comprising a core is referred to as a "cored substrate". A package substrate that does not comprise a core is generally referred to as a "coreless substrate". The core may comprise a dielectric organic or inorganic material, and may have conductive vias extending through the body of the core to interconnect conductive structures on both sides of the core Here, the term "land" refers to the side of an IC package or package substrate that has contacts, such as bond pads, that are bonded to a printed circuit board (e.g., a computer motherboard) to attach the package to the board. The term "land side" is generally used to refer to the "bottom" side of the package substrate.

Here, the term "die side" generally refers to the side of an IC package or package substrate to which one or more IC dies are bonded. The die side is opposite to the land side of the package.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "microprocessor" generally refers to an integrated circuit (IC) package comprising a central processing unit (CPU) or microcontroller. The microprocessor package may comprise a land grid array (LGA) of electrical contacts, and an integrated heat spreader (IHS). The microprocessor package is referred to as a "microprocessor" in this disclosure. A microprocessor socket receives the microprocessor and couples it electrically to the PCB.

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile", "plan", and "isometric" correspond to orthogonal planes within a cartesian coordinate system. Thus, cross-sectional and profile views are taken in the x-z plane, plan views are taken in the x-y plane, and isometric views are taken in a 3-dimensional cartesian coordinate system (x-y-z). Where appropriate, drawings are labeled with axes to indicate the orientation of the figure.

Various embodiments describe an architecture which comprises magnetic materials in conjunction with plated through-hole (PTH) via technology to increase inductance density and quality. In some embodiments of the disclosure, multiple PTH vias are formed within a magnetic core block that is formed within a trench or cavity made in the package core of a cored substrate of an integrated circuit (IC) package, or formed in the dielectric of a coreless package substrate. The trench or cavity is filled with a high permeability magnetic material, having a relative magnetic permeability ranging between 5 and 20. The process creates an integrated inductor unit with a large inductance that may range between 2 and 6 nanohenries (nH), and a relatively high quality factor (Q) of 13-16, while confining the magnetic fields mostly within the magnetic core. This technology is contrasted to more conventional air core integrated inductors, where inductor windings are embedded in package dielectric. For an equivalent inductance, an air-core inductor may occupy several times the footprint of the disclosed integrated magnetic core inductor. In some embodiments, high permeability magnetic films are used as inter-layer dielectrics in the package. In some embodiments, the magnetic inductors are formed in the package substrate.

The inductor architecture described herein, which includes inductors embedded within the magnetic core block, is contrasted to integrated PTH inductors that are coaxial with a magnetic core material, and the coaxial inductors are embedded in package dielectric material. The scheme affords an increase in inductance density, permitting an increased quality factor (Q-factor, or Q) and voltage regulator efficiency compared to package-integrated coaxial inductors. Higher inductance density allows for better filtering and reduction of ripple current in a compact inductor volume.

There are many technical effects of the various embodiments. For example, the embodiments provide higher efficiency of integrated voltage regulator (IVR) circuits. As an example, a fully integrated voltage regulator (FIVR) may be exhibit higher performance in terms of lower conversion losses. For example, more inductors with higher inductance can be packed in a smaller area for use with a voltage regulator.

Currently, some build-up package manufacturing processes use high-permeability magnetic films as interlayer dielectrics. Package architectures using magnetic films generally sandwich spiral pancake inductors between magnetic films, which provide a magnetic core, increasing the inductance of the inductor. The magnetic films are generally not capable of localizing the magnetic material to the inductor, permitting adventitious coupling to interlayer circuits as well as to attached active IC dies. Mitigation of this effect generally requires dielectric layers above and below the inductor layers, increasing the layer count. The flat architecture limits the use of layers above and below the inductor for signaling, increasing the layer count of the package substrate.

Various embodiments herein describe a process that uses high permeability material for forming inductors with minimum disruption to existing substrate manufacturing and assembly processes. Various embodiments may leverage well understood substrate manufacturing processes such as plated through-hole (PTH) drilling, and so are also readily scalable. Other technical effects will be evident from the various embodiments and figures.

FIG. 1 illustrates a plan view of integrated inductor unit 101 using PTH vias in a trench magnetic core, according to embodiments of the disclosure.

In FIG. 1, integrated inductor unit 101 is shown as an inductor structure embedded within a microelectronics IC package substrate 100. The view is a section cut through a level in the x-y plane of an embedded structure within a package substrate. Integrated inductor unit 101 comprises one or more inductors 102 embedded within magnetic core block 103. In some embodiments, inductors 102 are PTH vias comprising dielectric plugs 104 within PTH sidewalls 105. In some embodiments, dielectric plugs 104 comprises a dielectric material such as, but not limited to, a silicate-based glass, a composite polymer and inorganic glass fill such as a fiberglass or a polycrystalline ceramic material. In some embodiments, dielectric plugs 104 comprises the same material as package substrate dielectric 106.

In some embodiments, package substrate dielectric 106 comprises materials such as, but not limited to, FR4 (e.g., epoxy-based laminate), bismaleimide-triazine, polyimide, silicon, etc.

Pitches $P_1$ and $P_2$ are indicative of center-to-center distances between inductors 102. While $P_1$ and $P_2$ are shown as being different in FIG. 1, they may be equal $P_1$ and $P_2$ are at least equal to the diameter of inductors 102. In some embodiments, inductors 102 have a diameter $d_1$ that ranges between 100 and 250 microns. Minimum values of pitches $P_1$ and $P_2$ may also range between 300 and 400 microns. As PTH vias, an inner diameter and outer diameter are indicated for inductors 102. In some embodiments, dielectric core plug 104 has a diameter $d_2$ ranging between 100 and 200 microns (e.g., inner diameter of inductors 102), and conductive sleeve 105 has an outer diameter ranging between 100 and 250 microns. As an example, dielectric plugs 104 has a diameter of 150 microns, and conductive sleeve 105 (and for inductors 102) has an outer diameter of 186 microns. Self-inductance of inductors 102 depends on diameters $d_1$ and $d_2$, as well as the length (dimension in the z-direction) of inductors 102. In some embodiments, inductors 102 may have different diameters and inter-inductor pitches.

Magnetic core block 103 is a common magnetic core for one or more inductors 102, confining magnetic flux substantially within the confines integrated inductor unit 101. In some embodiments, magnetic core bed 103 is a common core for multiple (e.g., two or more) inductors 102, permitting sharing of magnetic flux between inductors 102. In implementations of integrated inductor unit 101, the architecture permits a relatively large coefficient of coupling between adjacent inductors 102 that are integrated into a package substrate, in comparison to air core inductors or to individual coaxial conductor/core units that might be formed in PTH vias, separated by other than magnetic material.

In some embodiments, magnetic core bed 103 comprises a magnetic material within a neutral (e.g., non-magnetic, non-conductive) matrix. In some embodiments, the matrix is a thermoplastic or thermosetting organic polymer comprising epoxy resins, polyamide resins, polyimide resins, polysulfones. Inorganic materials such as silica filler, silicates, may also be included. In some embodiment, magnetic core block 103 comprises a magnetic material having a relative magnetic permeability between 5 and 20.

Suitable magnetic materials include, but are not limited to, any of iron, nickel, nickel-iron alloys such as Mu metals and/or permalloys. In some embodiments, magnetic materials comprise lanthanide and/or actinide elements. In some embodiments, magnetic core block 103 comprises cobalt-zirconium-tantalum alloy (e.g., CZT). Suitable magnetic materials may also comprise semiconducting or semi-metallic Heusler compounds and non-conducting (ceramic) ferrites. In some embodiments, ferrite materials comprise any of nickel, manganese, zinc, and/or cobalt cations, in addition to iron. In some embodiments, ferrite materials comprise barium and/or strontium cations. Heusler compounds may comprise any of manganese, iron, cobalt, molybdenum, nickel, copper, vanadium, indium, aluminum, gallium, silicon, germanium, tin, and/or antimony. Heusler alloy, Co, Fe, Ni, Gd, B, Ge, Ga, permalloy, or yttrium iron garnet (YIG), and wherein the Heusler alloy is a material which includes one or more of: Cu, Mn, Al, In, Sn, Ni, Sb, Ga, Co, Fe, Si, Pd, Sb, V, Ru, Cu2MnAl, Cu2MnIn, Cu2MnSn, Ni2MnAl, Ni2MnIn, Ni2MnSn, Ni2MnSb, Ni2MnGa Co2MnAl, Co2MnSi, Co2MnGa, Co2MnGe, Pd2MnAl, Pd2MnIn, Pd2MnSn, Pd2MnSb, Co2FeSi, Co2FeAl, Fe2VAl, Mn2VGa, Co2FeGe, MnGa, MnGaRu, or Mn3X, where 'X' is one of Ga or Ge.

Materials such as Pt, Pd, W, Ce, Al, Li, Mg, Na, Cr2O3, CoO, Dy, Dy2O, Er, Er2O3, Eu, Eu2O3, Gd, Gd2O3, FeO, Fe2O3, Nd, Nd2O3, KO2, Pr, Sm, Sm2O3, Tb, Tb2O3, Tm, Tm2O3, V, V2O3 or epoxy material with particles of a magnetic alloy. A magnetic alloy can be an alloy formed of one or more of: Pt, Pd, W, Ce, Al, Li, Mg, Na, Cr, Co, Dy, Er, Eu, Gd, Fe, Nd, K, Pr, Sm, Tb, Tm, or V.

While some of the magnetic materials are conductors, it is understood that the composite is electrically non-conductive to avoid short-circuiting the PTH sidewalls 105.

In some embodiments, package substrate 100 is a coreless build-up (e.g., BBUL) substrate. In a coreless substrate, magnetic core block 103 is embedded within layers of package dielectric 106. In some embodiments, package dielectric 106 is a multiple-layer stack of overlaid sheets of laminated film (e.g., build-up film). Package dielectric materials may include composite epoxies, liquid crystalline polymers and polyimides. Other suitable materials may be employed. In some embodiments, package dielectric is a monolithic block rather than laminated film. Suitable organic or inorganic materials may be employed. Materials may include FR4 (e.g., epoxy-based laminate), bismaleimide-triaxine, polyimide, silicon, etc. In alternative embodiments, package dielectric 106 comprises a molded material, such as, but not limited to, an epoxy resin.

Figure 2A:
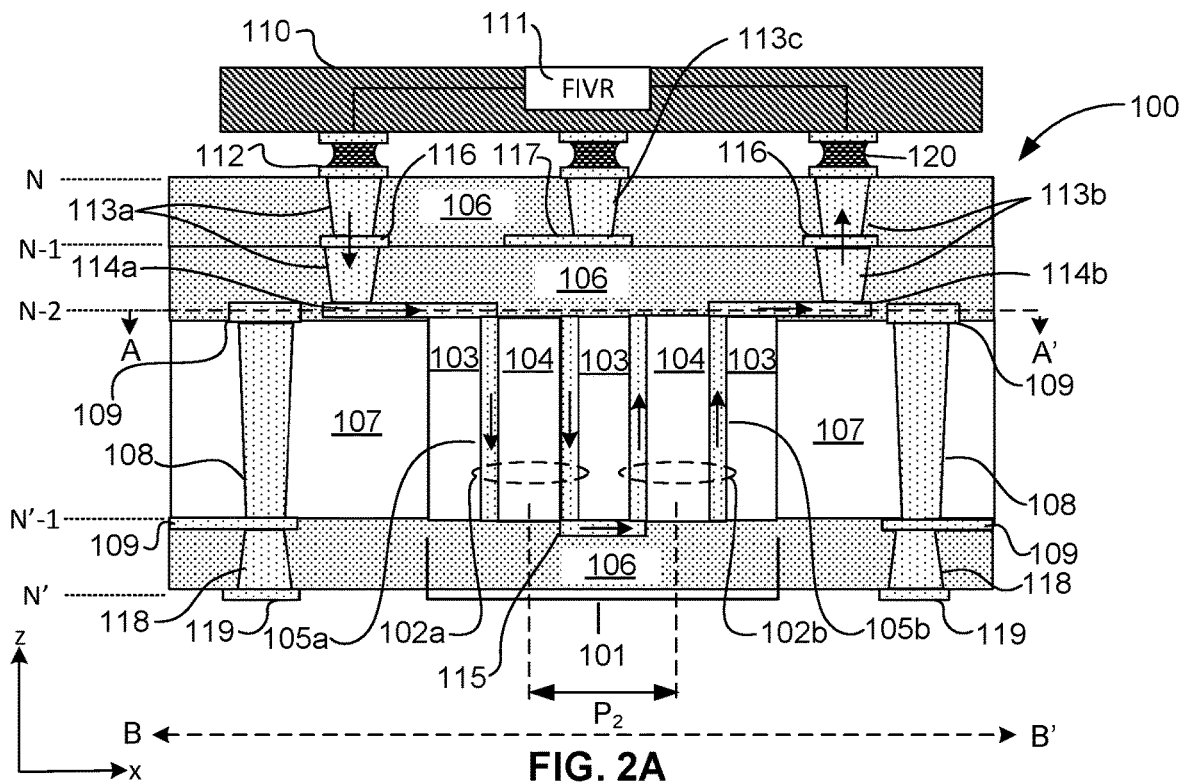
FIG. 2A illustrates a cross-section view of an integrated inductor unit embedded within an integrated circuit (IC) package substrate, according to some embodiments of the disclosure.

FIG. 2A illustrates a cross-section view of integrated inductor unit 101 within package substrate 100, according to some embodiments of the disclosure.

The cross-sectional view in FIG. 2A shows integrated inductor unit 101 embedded within package substrate core 107 in package substrate 100, which is a cored package substrate. Integrated inductor unit 101 comprises plated through-hole (PTH) inductors 102a and 102b and magnetic core block 103. PTH inductors 102a and 102b are shown in FIG. 1 as PTH inductors 102. Reference numerals that are appended by "a" and "b" are sub-references employed for purposes of clarity to distinguish the features such as inductors 102 on the left (a) or right (b) sides of the figure, respectively. The sub-references serve to individualize PTH inductors 102 to facilitate the description of current flow through integrated inductor unit 101, as explained below. At times, the reference numeral 102 without the sub-references will be used to refer to PTH inductors collectively. In the cross-sectional view of FIG. 2A, PTH inductors 102a and 102b are oriented vertically within magnetic core block 103, and are parallel to each other.

In the illustrated embodiment, package substrate core 107 is sandwiched between package dielectric 106, where layers of dielectric 106 are disposed on both sides of package substrate core 107. In some embodiments, only one side of package substrate core 107 is overlaid by one or more layers of package dielectric 106, leaving the opposing side exposed. In implementations where one side of package substrate core 107 is covered by dielectric 106, the exposed surface of package substrate core 107 is metallized with land side bond pads. Package dielectric 106 is shown as a stack of interlayer laminates comprising dielectric film layers between conductive layers, as described above for FIG. 1. Laminate sheets of package dielectric 106 are interlaid between conductive layers labeled N−2 through N on the die side of package substrate 100, and between N' and N'−1 on the land side of package substrate 100. In some embodiments, package substrate 100 is formed by build-up lamination methods, where sheets of package dielectric are overlaid one over the other to build up an organic package substrate.

An example is a package substrate formed by bumpless build-up layer (BBUL) methodology. The term "bumpless" refers to dielectric layers of substrate and components and conductive structures embedded within the dielectric layers, where no solder balls or bumps are used as means of attachment. In this methodology, multiple layers of non-rigid dielectric film may be laminated one at a time to form a stack of overlaid laminates of package dielectric on a rigid core (e.g., package substrate core 107). According to embodiments, package substrate core 107 is a permanent component of the package substrate 100.

The package core panel provides a rigid mechanical support for the fabrication of a cored BBUL package substrate (e.g., package substrate 100), formed by lamination of dielectric layers and of metallization structures as described above. In some embodiments, package substrate core 107 comprises materials such as, but not limited to, fiberglass-reinforced epoxy resins, glass, or polymer-ceramic composites.

Package substrate core 107 may be a rigid layer within package substrate 100, and may provide mechanical support to the less rigid laminate film of package dielectric 106, lending higher mechanical strength to package substrate 100 than package dielectric 106 alone. Warpage may also be mitigated by inclusion of package substrate core 107. In some embodiments, package substrate 100 is a coreless package, comprising a stack of laminated interlayer dielectric film. Through-hole vias 108 extend through package substrate core 107 and may interconnect traces 109 disposed over opposing sides of package substrate core 107. In some embodiments, through-hole vias 108 deliver power from a motherboard to which package substrate 100 is coupled to one or more attached dies (e.g., die 110). In some embodiments, traces 109 are disposed at the deepest conductive levels on package substrate core 107. In some embodiments, traces 109 couple through-hole vias 108 to land side pads 119 and die side pads 112 on the surfaces of package substrate 100.

In some embodiments, magnetic core block 103 extends through package substrate core 107 and interfaces layers of dielectric 106 disposed immediately over and under package substrate core 107. In alternative embodiments, magnetic core block 103 extends partially through package substrate core 107. In the illustrated embodiment, PTH inductors 102 are embedded within magnetic core block 103 and extend therethrough. In the illustrated embodiment, PTH inductors 102a and 102b are interconnected by trace 115 extending laterally in the x-direction between individual inductors 102a and 102b.

In the figure, two adjacent PTH inductors 102a and 102b are indicated by the dashed circles. In general, PTH vias have conductive sidewalls (e.g., PTH sidewalls 105) that are plated into through-holes made in a package core (e.g., package substrate core 107) or printed circuit board. Generally, the surface of the through-hole is plated, leaving a smaller through-hole surrounded by conductive PTH sidewalls 105.

PTH inductors 102 comprise dielectric plugs 104 that fill the through-hole surrounded by PTH sidewalls 105. In the illustrated embodiment, serially-coupled PTH inductors 102a and 102b are to function as a single inductor. PTH inductors 102a and 102b may be serially coupled to increase the overall length and therefore increase the overall self-inductance. Current flow, as indicated by the arrows within the conductive portions (e.g., PTH sidewalls 105a and 105b), travels from left to right in the figure. As an example, current enters PTH inductor 102a, which is coupled to a current source represented by FIVR circuit 111 on die 110, and exits from PTH inductor 102b, which is coupled to a current sink, also represented by FIVR 111. In some embodiments, die 110 comprises a tuned radio frequency (RF) circuit coupled to integrated inductor 101. The tuned RF circuit may be a RF oscillator circuit, an RF amplifier circuit or a RF mixer circuit.

Die 110 is attached package substrate 100 by solder joints 120 over top layer (e.g., first-level interconnect (FLI)) bond pads 112 in conductive layer N on the die side surface of package substrate 100. In the illustrated embodiments, bond pads 112 couple FIVR 111 to the circuit of integrated inductor 101. Interlayer vias 113 extend vertically (z-direction), interconnecting bond pads 112 in conductive layer N to structures including pads/traces 116 and 117 in conductive level N−1, and to structures including traces 114 and pads/traces 109 in conductive level N−2. During operation, current, as indicated by the arrows, emanates from FIVR 111 on die 110 and enters package substrate 100, to be carried by interlayer vias 113a to trace 114a. Current flows into PTH sidewall 105a of PTH inductor 102a. Trace 115 in land side conductor layer N'−1 interconnects PTH sidewall 105a to PTH sidewall 105b of PTH inductor 102b. Current flows from PTH inductor 102a to PTH inductor 102b through trace 115. Current in PTH sidewall 105b flows into trace 114b (conductive layer N−2) at the output of integrated inductor 101, and returns to FIVR 111 through interlayer vias 113b.

During operation, current flows in PTH inductors 102a and 102b in opposing directions because of the parallel geometry of series-coupled PTH inductors 102. The parallel geometry may be recognized as a double-turn inductor, where inductors 102a and 102b are two turns or passes of a coil winding through a magnetic core.

In the illustrated embodiment, PTH inductors 102a and 102b are series-coupled as described, and have opposing current flow when in operation. Some negative magnetic coupling may occur, resulting in negative mutual inductance between adjacent inductors. The negative mutual inductance reduces inductance density. To mitigate this effect, pitch $P_2$ may be adjusted to minimize negative coupling. The degree of inductive coupling generally falls off with the distance between individual inductors 102.

Further, high-permeability magnetic materials (e.g., materials having a relative magnetic permeability greater than 10) in magnetic core block 103 may also concentrate flux densities close to conductive PTH sidewalls 105a and 105b.

The largest flux density may then be confined in close proximity to the individual inductors (e.g., PTH inductor 102a), reducing interaction with magnetic flux from an adjacent inductor (e.g., PTH inductor 102b). In some embodiments, three or more individual PTH inductors 102 (e.g., inductor chain made by forming a daisy chain comprising PTH inductors 102a-102b-102a-102b, etc.) form a serpentine inductor extending in the x-direction (not shown). A serpentine inductor formed by interconnecting multiple adjacent PTH inductors 102 has an inductance augmented over individual inductors 102 as segments in the chain. The inductance gained by daisy-chaining individual PTH inductors 102 is approximately equal to the number of individual inductors in the daisy chain minus the negative mutual inductance from opposing current paths in the adjacent inductors 102.

Figure 2B:
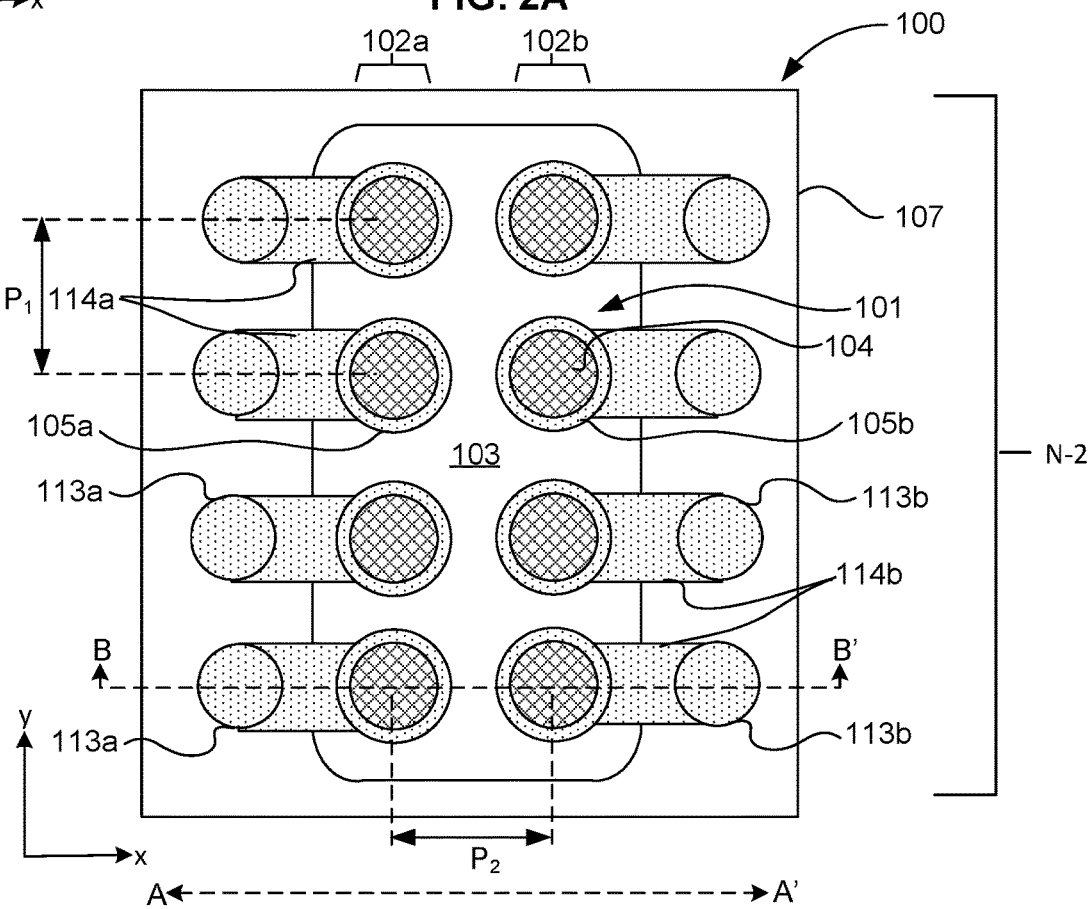
FIG. 2B illustrates a plan view of an integrated inductor unit embedded within an integrated circuit (IC) package substrate, according to some embodiments of the disclosure.

FIG. 2B illustrates a plan view of integrated inductor unit 101 embedded within package substrate 100, according to some embodiments of the disclosure.

In FIG. 2B, the cross-sectional view of FIG. 2A is taken from cut B-B'. integrated inductor unit 101 is viewed from above the level of cut A-A' in FIG. 2A. The view is taken at conducive level N−2. Here, an array of PTH inductors 102 is arranged in left-hand (102a) and right-hand rows (102b) in relation to the figure. Sub-references "a" and "b" are again used to indicate left- and right-hand rows of PTH inductors 102 extending in the y-direction in the figure. The array extends in the x- and y-directions, and is confined within magnetic core block 103. Traces 114a and 114b in conductive level N–2 respectively couple PTH sidewalls 105a and 105b to interlayer vias 113a and 113b, the bases of which are shown.

In some embodiments, inductors 102a and 102b in the array are independently coupled to circuitry on a die attached to package substrate 100 (e.g., die 110 in FIG. 2A). As an example, a microprocessor may have multiple power rails, each rail coupled to a FIVR for regulating the rail voltage. In turn, each FIVR is coupled to a separate inductor pair (comprising a pair of PTH inductors 102a and 102b) within magnetic core block 103. The individual inductors share the same core block (e.g., magnetic core block 103), and are magnetically coupled to all other PTH inductors 102 that are within magnetic core block 103, resulting in mutual inductances between all inductors 102. Mutual inductances are positive for inductors in a particular row of the array (e.g., between all PTH inductors 102a or between all PTH inductors 102b) due to positive magnetic coupling. Conversely, mutual inductances are negative between PTH inductors in opposing rows (e.g., between PTH inductors 102a and 102b).

By virtue of the relatively high magnetic permeability compared (e.g., relative permeability ranging between 5 and 20) of the magnetic material of magnetic core block 103 relative to air-core integrated inductors, the inductance density of integrated inductor unit 101 may be several times higher than an air-core inductor having equivalent dimensions. As an example, an air-core inductor integrated into package dielectric material may have an inductance of less than 1 nH. In contrast, integrated inductor unit 101 may be several times smaller in volume than an air-core inductor having an inductance of 2 nH or greater, typically 3 to 6 nH. Consequently, integrated inductor unit 101 may have a significantly smaller footprint within package substrate 100 than an equivalent air-core inductor. As a consequence, a more compact overall footprint may be achieved for an IC package incorporating integrated inductor unit 101 in comparison to IC packages having integrated air-core inductors.

Smaller package z-height may also be enabled by embedding high-inductance density inductor unit 101 within package substrate 100 in comparison to an integrated air core inductor having an equivalent inductance density. Discrete inductors may be exemplified by MIAs (magnetic inductor arrays), introduced earlier. MIA modules are externally mounted on the land side of the package substrate, adding to the overall package thickness. Integrated inductor unit 101 may have an inductance density equivalent to an externally bonded MIA module but occupies a volume within the package substrate. Accordingly, the embedded magnetic core architecture enables reduced overall package thickness while providing a large inductor for power management circuitry such as a FIVR on an attached die (e.g., die 110).

Integrated inductor unit 101 is further contrasted to an external MIA module. The current paths between an attached die (e.g., die 110, FIG. 1A) and integrated inductor unit 101 are significantly shorter than current paths would be between an attached die and a MIA. Shorter current paths have lower dc and ac resistance, as well as smaller stray inductance and capacitance at signal frequencies that are typically 100 MHz or greater.

As an example, self-inductance values of 1 nH or less, which are typical for air core buck conversion inductors, may significantly degrade IVR performance as switching losses at high frequencies can be high. High switching frequencies may cause large gate-drive losses as the gate capacitive reactance may be relatively low. On the other hand, to produce required buck voltages using low-inductance (low Q) inductors, IVR switching frequencies need to be proportionately high (e.g., 140 MHz or higher). Additionally, the low inductance of air-core inductors is not sufficient to effectively choke the ripple current that results from the conversion. Large switching losses may result as the high ripple current is conducted through the on-die metallization, as well as through the on-resistance of the MOSFET switching transistors.

In contrast, the self-inductance of individual PTH inductors 102a or 102b within magnetic core block 103 according to the disclosed embodiments may have an inductance of approximately 3 nH. In contrast, an air-core inductor having a pitch of 350 microns on a 740-micron thick core may have an inductance of 0.6 nH. At switching frequencies of 100 MHz or higher, inductances of 2 nH or more are sufficient to reduce ripple current to the point where losses are low. Higher inductance also enables the use of lower switching frequencies. Higher peak conversion efficiencies in the IVR circuit may be realized by lowering switching frequencies, as gate drive losses are reduced at the lower frequencies.

The inductance values quoted here are exemplary. Values of inductance depend on the relative permeability of the magnetic core, as well as the dimensions of PTH inductors 102. The same PTH inductors 102 embedded within a non-magnetic dielectric core (e.g., air-core inductors) may have self-inductance values three to four times less than integrated inductor unit 101.

Referring once again to FIG. 2B, inductors aligned in the two rows extending in the y-direction are labeled 102a and 102b. Integrated inductor unit 101 comprises a linear array of daisy-chained pairs of inductors, where each pair comprises one of inductors 102a coupled to one of inductors 102b (as shown in FIG. 2A for a single pair along cut B-B'). Currents through inductors 102a run in a first direction, whereas currents in inductors 102b run in a second direction opposed to the first direction. Magnetic fields that occur between inductors 102a and 102b negatively couple when passing current, whereas coupling between inductors within a row (e.g., 102a to 102a coupling or 102b to 102b coupling) is positive, increasing and reinforcing mutual inductance between PTH inductors within the rows of PTH inductors (e.g., row of PTH inductors 102a or 102b).

Magnetic core block 103 enhances mutual inductance between an array of PTH inductors 102 (embedded within magnetic core block 103) As an example, two positively coupled PTH inductors 102a (e.g., two independent inductors 102a) within a magnetic core block (e.g., magnetic core block 103) have a mutual inductance of 0.425 nH, Mutual inductance values depend on the relative permeability of the magnetic material, as well as the separation distance between and dimensions of the individual inductors. Higher mutual inductance increases overall inductance density for multi-turn integrated inductors, as shown in FIG. 2B for multiple independent inductor pairs, or for daisy-chained inductor pairs forming a solenoid. Thus, the Q-factor is increased further by enhanced mutual inductance.

In some embodiments, multiple PTH inductors 102a or 102b are not interconnected, and currents through the PTH inductors 102a or 102b are independent. In these embodiments, currents may be directed to flow in the same direction in each of inductors 102a or 102b, causing positive coupling, enhancing the inductance further. This architecture is described below.

Figure 3A:
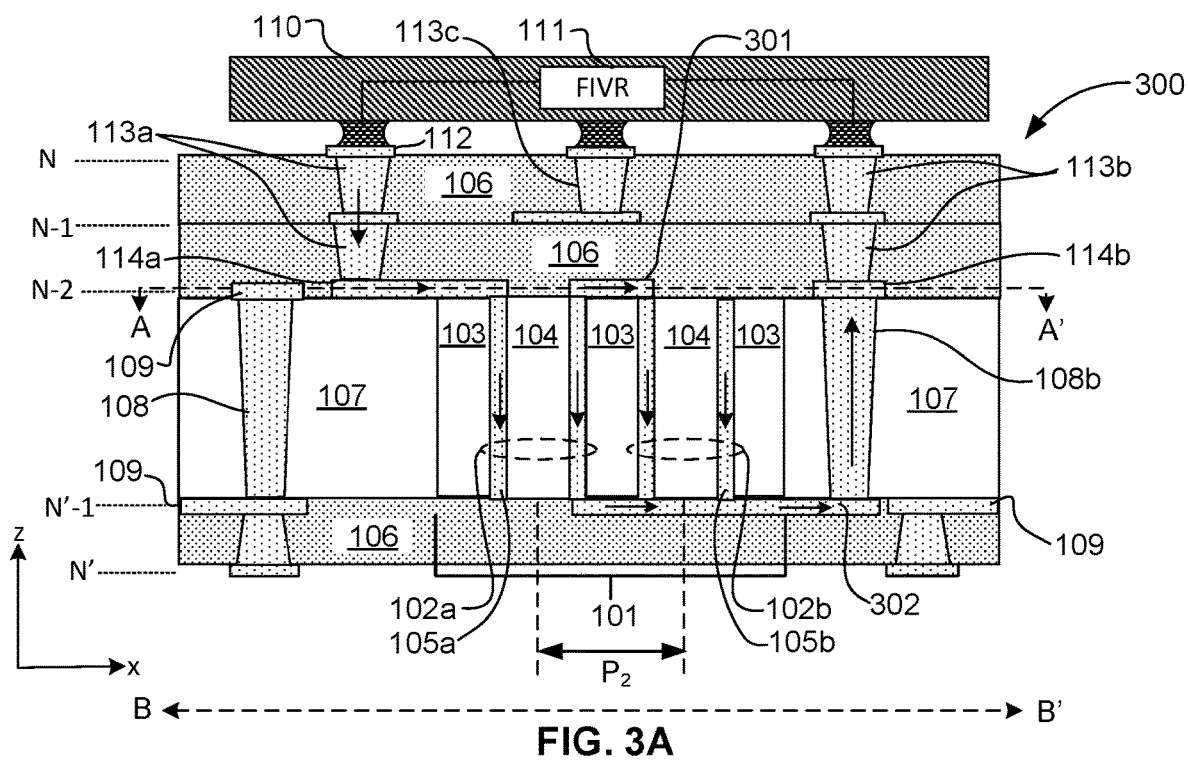
FIG. 3A illustrates a cross-section view of integrated inductor unit within IC package substrate, having individual inductors connected in parallel, according to some embodiments of the disclosure.

FIG. 3A illustrates a cross-section view of integrated inductor unit 101 within package substrate 300, having individual inductors 102 connected in parallel, according to some embodiments of the disclosure.

The cross-sectional view in FIG. 3A shows integrated inductor unit 101 embedded within dielectric 106 of package substrate 300. The general description pertaining to package substrate 100 architecture in FIGS. 2A and 2B also pertains to package substrate 300.

Integrated inductor unit 101 comprises PTH inductors 102a and 102b electrically coupled in parallel. PTH inductors 102 extend in the z-direction through magnetic core block 103, between opposing sides of package substrate core 107. Dielectric plugs 104 are contained within conductive PTH sidewalls 105. Conductive layers over both sides of package substrate core 107 comprise conductive structures such as, but not limited to, traces 109, 114, 301 and 302. Interconnections of PTH inductors 102 to the conductive layers are shown. In the illustrated embodiment, two adjacent inductors 102a and 102b are shown extending in the z-direction through magnetic core 103 and interconnected by traces 301 and 302 extending laterally between PTH inductors 102a and 102b over both sides of package substrate core 107. In the orientation of FIG. 3A, the upper side (relative to the figure) of package substrate core 107 is toward the die side, and the lower side of package substrate core 107 is toward the land side.

When in operation, arrows indicate an exemplary current flow in PTH sidewalls 105a and 105b, as well as through traces 114a, 114b in die-side conductive layer N−2, and traces 301 and 302 in land-side conductive layer N'−1. Trace 301 interconnects PTH inductors 102a and 102b in electrical parallel, allowing current to flow from a current source such as FIVR 111 on die 110 through interlayer vias 113a, coupled by trace 114a to PTH inductor 102a. Current is distributed to PTH inductor 102b by trace 301 at the top of PTH inductors 102, and flows in the same direction through both PTH inductors 102a and 102b (top to bottom in the figure).

When in operation, trace 302 at the output of integrated inductor 101 collects currents flowing out of both PTH inductors 102a and 102b. Trace 302 couples the output of integrated inductor unit 101 to a current sink on die 110 through through-via 108 on the left side of the figure, and interlayer via 113b. An example of a current sink is a load coupled to a converter circuit of FIVR 111 on die 110.

Parallel currents flowing through PTH inductors 102a and 102b induces positive mutual inductance, resulting in an augmentation of the inductance density beyond any gain in the geometric inductance obtained by doubling the length of the individual PTH inductors 102 when connected in series. To further enhance this effect, the coupling coefficient may be increased by reducing the pitch $P_2$.

Figure 3B:
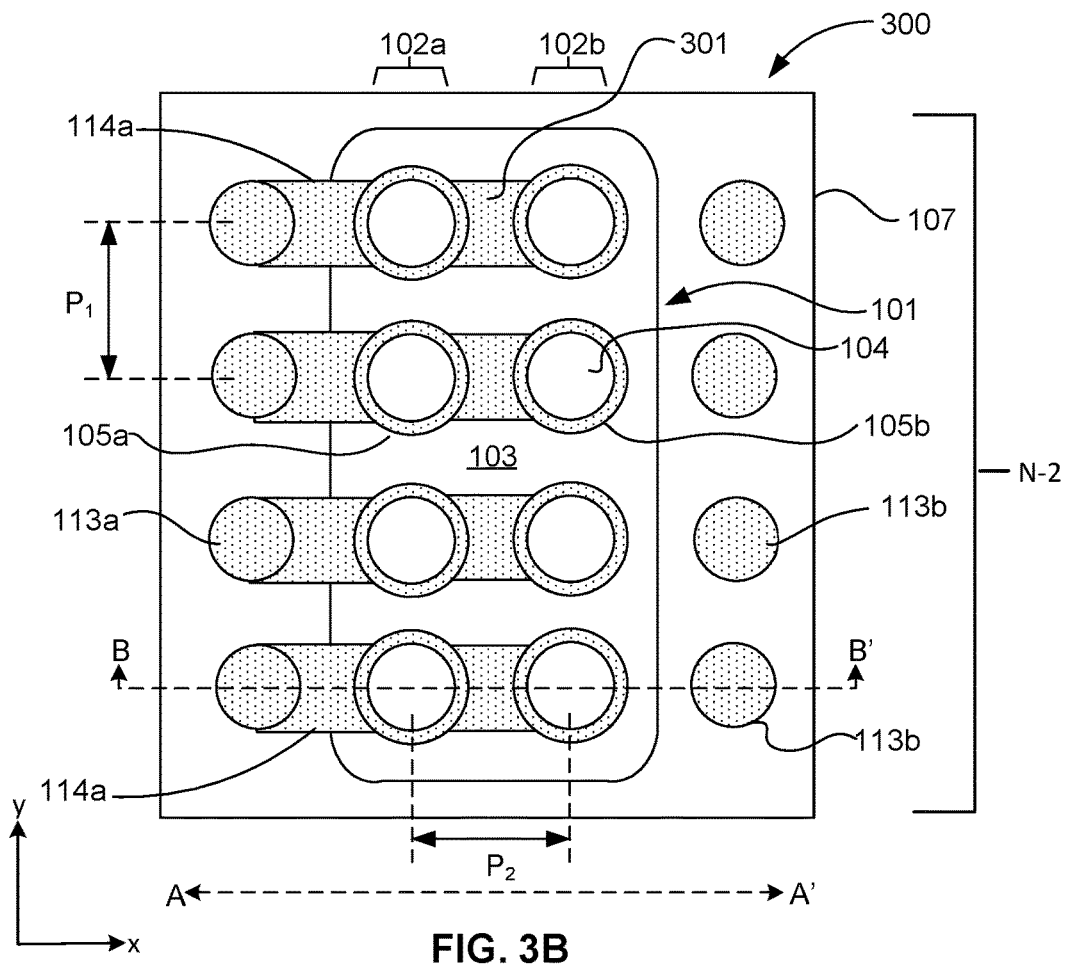
FIG. 3B illustrates a plan view of an integrated inductor unit within an IC package substrate, having individual inductors connected in parallel, according to some embodiments of the disclosure.

FIG. 3B illustrates a plan view of integrated inductor unit 101 within package substrate 300, having individual PTH inductors 102 connected in parallel, according to some embodiments of the disclosure.

In FIG. 3B, integrated inductor unit 101 is viewed from above the level of cut A-A' indicated in FIG. 3A. Once again, the view is taken at conductive layer N−2. Here, an array of multiple PTH inductors 102a and 102b extends in the x- and y-directions, but confined within magnetic core block 103. Traces 114a and 114b couple PTH sidewalls 105a and 105b, respectively, to interlayer vias 113a and 113b. As is seen in FIG. 3B, the cross-sectional view shown in FIG. 3A is taken from cut B-B'.

In an exemplary implementation, inductor pairs comprising interconnected individual PTH inductors 102a and 102b in the array are independently coupled to circuitry (e.g., FIVR 111) on die 110. In some embodiments, die 110 is a microprocessor. As an example, a microprocessor (e.g., die 110) may have four power rails, each rail coupled to a FIVR for regulating the rail voltage. Integrated inductor unit 101 comprises four independent inductor pairs comprising interconnected PTH inductors 102a and 102b. Continuing with the example, each pair of PTH inductors 102 may be coupled to one of the FIVR circuits on die 110 through interlayer vias 113a and 113b, respectively providing input and output to integrated inductor 101.

Referring once again to FIG. 3B, integrated inductor unit 101 comprises a linear array of parallel pairs of inductors, each pair comprising one of inductors 102a and one of inductors 102b (as shown in FIG. 3A for a single pair along cut B-B'). Inductors aligned in the two rows extending in the y-direction are labeled 102a and 102b. Here, a gain in inductance density may be realized due to the parallel connection of inductors 102a and 102b, allowing parallel current flow through both inductors in each pair, thereby increasing mutual inductance and the inductance density by positive magnetic coupling. Coupling may be optimized by adjustment of pitch $P_2$. For example, $P_2$ may be reduced to increase positive coupling between inductors 102 within magnetic core block 103.

Figure 4A:
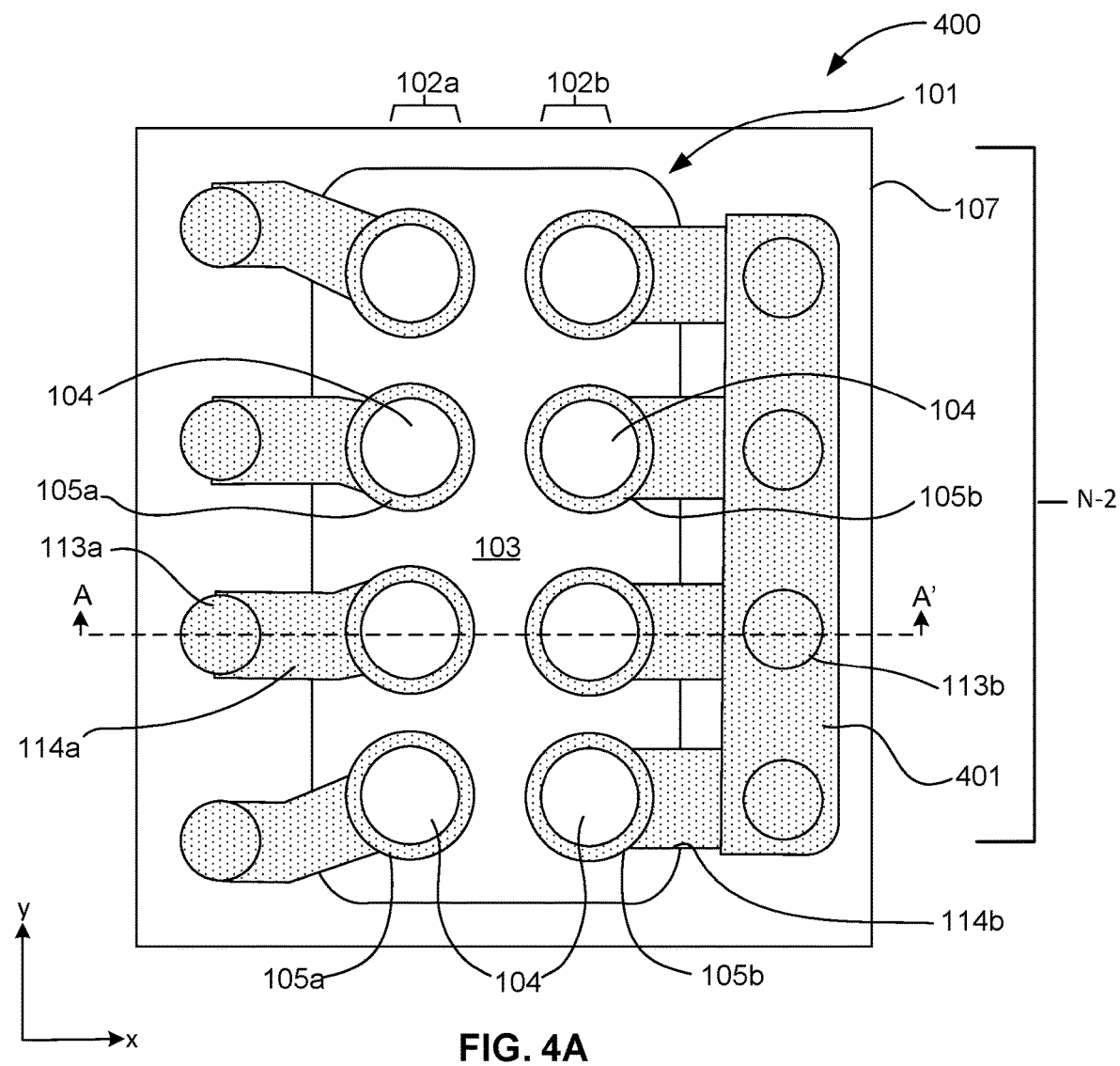
FIG. 4A illustrates a plan view of an IC package substrate having integrated inductor unit comprising a common bus trace coupled to the output side of the integrated inductor unit, according to some embodiments of the disclosure.

FIG. 4A illustrates a plan view of package substrate 400 having integrated inductor unit 101 comprising a common bus trace 401 coupled to the output side, according to some embodiments of the disclosure.

In FIG. 4A, integrated inductor unit 101 is shown in plan view. The vertical level within package substrate 400 is the same level at which cut A-A' is taken in package substrate 300 (FIG. 3A), coinciding with die-side conductive level N−2. In an architecture similar to package substrate 300, package substrate 400 comprises multiple pairs of interconnected PTH inductors 102a and 102b extending in the z-direction through magnetic core block 103 integrated in dielectric 106. PTH inductors 102a and 102b are respectively arranged in rows that extend in the y-direction. In the illustrated embodiment, PTH inductors 102b are interconnected by traces 114b (at the output of integrated inductor unit 101) leading to common bus trace 401, tying together the outputs of each inductor pair. In some embodiments, PTH inductors 102b are shorted together by bus trace 401. Shown within bus trace 401 are tops of interlayer vias 113b, carrying the output of each inductor pair to bus trace 401.

In some embodiments, interlayer vias 113b are output vias to return current (e.g., output) to a die attached to package substrate 400 (e.g., die 110 in FIGS. 2A and 3A). Inductors 102a are individually routed to tops of interlayer vias 113a by traces 114a. Individual PTH inductors 102a and 102b may be daisy-chained together to form a single inductor (shown in FIG. 4B). In other embodiments, PTH inductors 102a and 102b are coupled in parallel, as shown in FIG. 3A. An example implementation may be for a multi-phase buck regulator circuit, where the output side of multiple inductors are shorted together and are coupled to a common load. The input side comprises inductors 102a on the left side of the figure. In some embodiments, each of inductors 102a are coupled, through interlayer vias 113a, to pairs of switching transistors in FIVR circuitry (e.g., a multiphase buck regulator in FIVR 111).

Traces 114a extend laterally between tops of interlayer vias 113a and PTH sidewalls 105a. In some embodiments, PTH sidewalls 105a extend above PTH dielectric plug 104 to form a contiguous structure with traces 114a. In some embodiments, interlayer vias 113a are coupled to traces 114a by formation of pads over interlayer vias 113a. Similarly, traces 114b extend laterally between PTH sidewalls 105b of inductors 102b and bus trace 401. In some embodiments, traces 114b are contiguous with conductive sleeves 105b and with bus trace 401. In some embodiments, PTH sidewalls 105b extend above PTH dielectric plugs 104 into the conductor level of traces 114b, where PTH sidewalls 105b join traces 114b. In some embodiments, traces 114b and bus trace 401 are within the same conductor level.

Figure 4B:
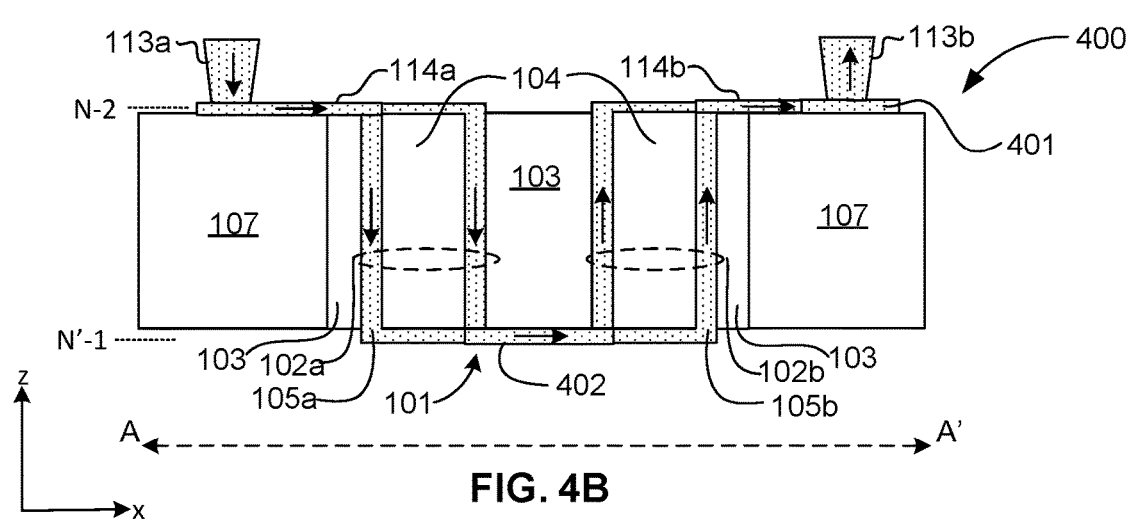
FIG. 4B illustrates a cross-sectional view of an IC package substrate having an integrated inductor unit comprising a common bus trace coupled to the output side of the integrated inductor unit, according to some embodiments of the disclosure.

FIG. 4B illustrates a cross-sectional view of package substrate 400 having integrated inductor unit 101 comprising a common bus trace 401 coupled to the output side, according to some embodiments of the disclosure.

In FIG. 4B, dielectric 106 has been omitted for clarity, showing package substrate core 107 and essential metallization structures including PTH sidewalls 105, traces 114, bus 401 in die-side conductive layer N−2 and trace 402 in land-side conductive layer N'-1. Inductors 102a and 102b (indicated by the dashed circles) extend vertically (in the z-direction) through magnetic core block 103 from the lower surface to the upper surface of magnetic core block 103 and are daisy-chained through trace 402. PTH sidewalls 105a and 105b are contiguous with lower trace 402. In some embodiments, PTH sidewalls 105a and 105b extend below PTH dielectric plugs 104 (and the lower surface of magnetic core block 103) to the conductor level comprising lower trace 402.

In some embodiments, conductive sleeves 105a and 105b extend above magnetic core block 103 to the conductive level of traces 114a and 114b. PTH sidewalls 105a and 105b are contiguous with traces 114a and 114b, respectively, which also couple to interlayer vias 113a and 113b, respectively. Although FIG. 4B does not show dielectric material (e.g., dielectric 106) above the upper conductor level that comprises traces 114a and 114b, it will be understood that a dielectric (e.g. dielectric 106) is normally present, as shown in FIGS. 2A and 3A.

Interlayer vias 113a and 113b extend from conductive level N−2 to N−1 (not shown) and couple PTH inductors 102a and 102b, respectively, to integrated circuitry of a FIVR or other device on an attached die (not shown in FIG. 4B; e.g., FIVR 111 on die 110 in FIGS. 2A and 3A). As described earlier, the integrated circuitry may comprise a buck or boost voltage regulator (e.g., FIVR 111, FIGS. 2A and 3A) coupled to one or more power rails of a microprocessor, represented by die 110 in FIGS. 2A and 3A. The arrows indicate the current paths and direction leading from a source coupled to interlayer via 113a, to a sink, coupled to interlayer via 113b. As an example, interlayer via 113a is coupled to a transistor switch pair of a multiphase buck regulator. The transistors may switch at frequencies above 100 MHz, generating a voltage square wave that sends pulsed direct current (dc) at that frequency through series-coupled PTH inductors 102a and 102b. The source voltage is reduced by the buck voltage generated in PTH inductors 102a and 102b, and returned to the FIVR (e.g., FIVR 111, FIGS. 2A and 3A) through via 113b. The sink may be a portion of the FIVR circuitry (e.g., FIVR 111, FIGS. 2A and 3A) presenting a load to the inductor comprising daisy-chained PTH inductors 102a and 102b. The load is also common to the other inductors in integrated inductor unit 101 that are coupled to the load through bus trace 401.

The pulsed dc is converted to a steady dc current by low-pass filtering action carried out by PTH inductors 102a and 102b coupled to capacitance shunting the load. Filtering efficiency is enhanced by the relatively high Q-factor (Quality factor, the ratio of inductive reactance to ac resistance) of inductors as a result of integration within the magnetic core block (e.g., magnetic core block 103). For example, ripple current is reduced as a result of increased Q-factor (i.e., higher inductance) afforded by the magnetic core block.

FIGS. 5A-5K illustrate an exemplary method for making integrated inductor unit 101 within package substrate 100, according to some embodiments of the disclosure.

Figure 5A:
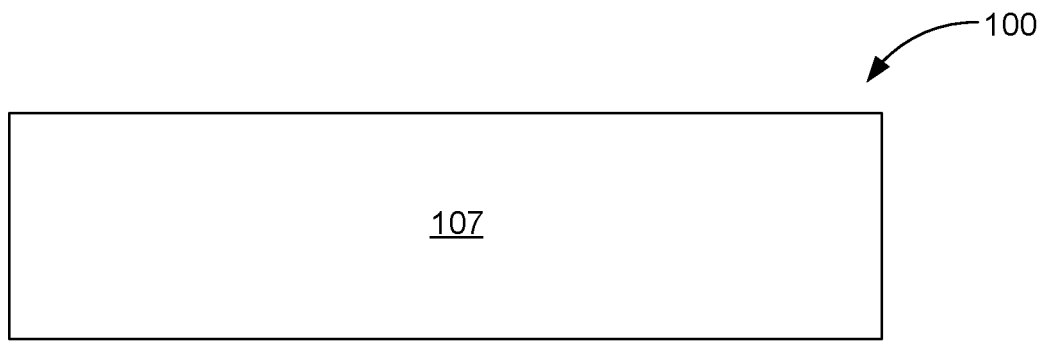
FIGS. 5A-5K illustrate a method for making an integrated inductor unit within an IC package substrate, according to some embodiments of the disclosure.

In the operation shown in FIG. 5A, package substrate core 107 is received as prepared in previous operations. Package substrate core 107 provides a rigid structure upon which package substrate 100 is built. In some embodiments, package substrate core 107 comprises a glass (e.g., fiberglass) and resin composite (e.g., pre-preg), having a thickness that ranges between 400 microns and 800 microns.

Figure 5B:
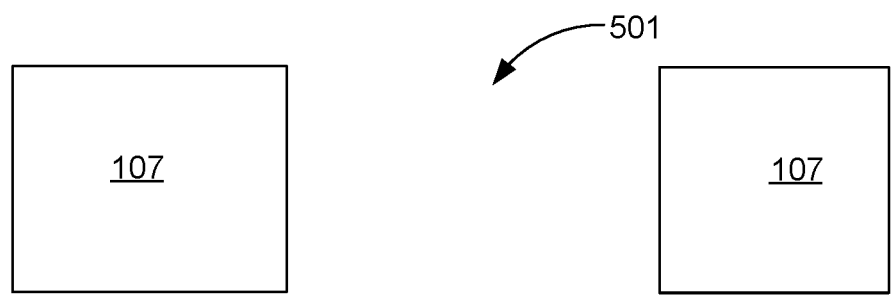

In the operation shown in FIG. 5B, cavity 501 is formed in package substrate core 107 in preparation for formation of an embedded magnetic core block (e.g., magnetic core block 103 in FIG. 2A). In some embodiments, package substrate core 107 is excavated to a specific depth within package substrate core 107 to form cavity 501. In some embodiments, cavity 501 is excavated completely through package substrate core 107. Cavity 501 may be formed by overlap drilling into the package substrate core 107. In some embodiments, cavity 501 is excavated by laser drilling. In alternative embodiments, cavity 501 is excavated by mechanical drilling.

Mechanical or laser drilling to form cavity 501 entails stepping the drill bit or laser beam by less than the drill diameter (e.g., less than half of the diameter). As an example, a computer numerical code (CNC) controlled drill or mill is directed to drill into package substrate core 107 to a specified depth, which includes the entire thickness of package substrate core 107, then displace in the x or y direction by half the drill diameter.

According to some embodiments, cavity 501 is excavated to a depth ranging between 150 to 800 microns, where cavity 501 partially or completely penetrates through package substrate core 107. In the embodiment illustrated in FIG. 5B, cavity 501 extends through the thickness of package substrate core 107. In some embodiments, cavity 501 is a rectangular opening having lateral dimensions ranging between 500 microns to 3 millimeters. In some embodiments, trench 501 has rounded corners.

Figure 5C:
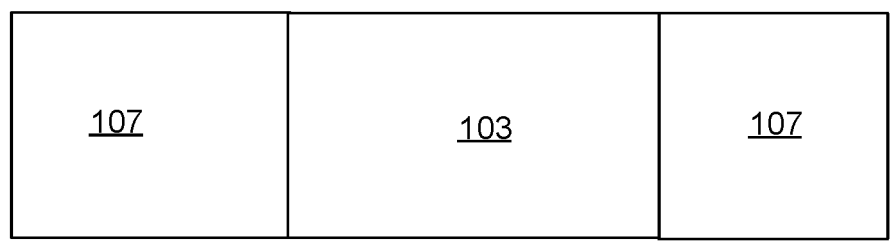

In the operation shown in FIG. 5C, cavity 501 is filled by magnetic core material for form magnetic core block 103. In some embodiments, the magnetic core material is deposited into cavity 501 as a liquid comprising magnetic particles suspended in a polymer matrix. Magnetic particle compositions are described above (e.g., see description relating to FIG. 1A). In various embodiments, the polymer matrix comprises a curable epoxy resin. The polymer matrix is in a liquid precursor state (e.g., an ink), where the polymer (e.g., an epoxy) is not crosslinked. The viscosity of the polymer matrix is adjustable for optimize deposition, and depends on the polymer chain lengths, degree of crosslinking in the precursor state, and the size and concentration of magnetic particles.

Deposition techniques for plugging trench 501 with the uncured magnetic core material include ink-jet printing. In some embodiments, a photo-patternable matrix material containing magnetic particles is deposited by spin coating or spray coating, and then patterned by lithographic techniques. The photo-patternable matrix may fill cavity 501 and be patterned to confine the material to cavity 501. A curing step may follow.

Once deposited and/or patterned, the magnetic material may be cured to solidify it into magnetic core block 103 that is integrated within package substrate core 107. In some embodiments, magnetic material is thermally cured by subjecting the material to temperatures ranging between 50° C. and 150° C. In some embodiments, the magnetic core material may be photo-cured. A photoinitiator may be included in the matrix for this purpose. Curing may be carried out by exposure to ultraviolet light.

In a subsequent operation, magnetic core block 103 may be planarized so as to be level with package substrate core 107.

Figure 5D:
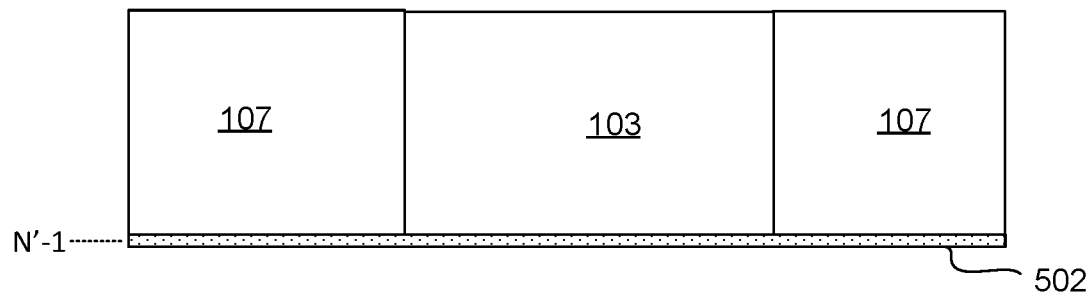

In the operation shown in FIG. 5D, a conductive layer 502 is formed over one side of package substrate core 107. In some embodiments, a conductive seed layer (not shown) precedes conductive layer 502. The conductive seed layer may comprise a suitable metal film comprising any of copper, nickel, gold, silver, tungsten or molybdenum and have a thickness ranging from 100 nanometers (nm) to several microns. The conductive seed layer may form an electrode surface (e.g., a cathode) upon which conductive layer 502 may be electrodeposited. In some embodiments, the conductive seed layer is formed by vacuum deposition methods such as, but not limited to, evaporation and sputtering (dc and rf). In some embodiments, the seed layer is formed by electroless deposition methods. In some embodiments, conductive layer 502 is formed by electrodeposition over the conductive seed layer. In some embodiments, conductive layer 502 is deposited to a thickness ranging from 10 microns to 40 microns. In some embodiments, conductive layer 502 comprises materials such as, but not limited to, copper, gold, silver, nickel, tungsten and molybdenum.

Figure 5E:
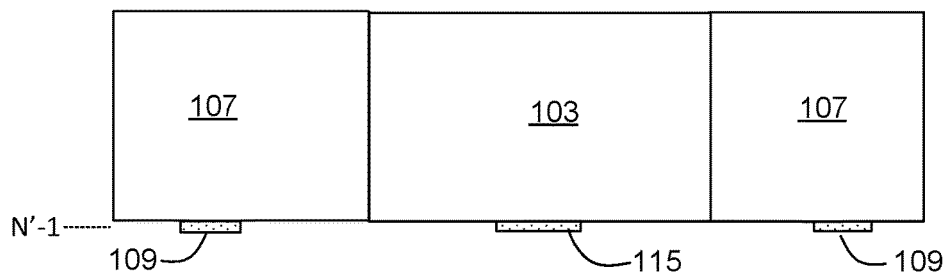

In the operation shown in FIG. 5E, conductive layer 502 is patterned to form conductive structures, such as traces 109 and 115, over what will be the land side of package substrate core 107, as shown in FIG. 2A.

In a subsequent operation (not shown), a conductive layer is deposited over seed layer 503. Seed layer 503 provides a conductive surface, and is a cathode for electrodeposition of thicker films of metal when coupled to a power supply. In some embodiments, package substrate 100 is immersed in a plating bath within a plating cell. The conductive layer may comprise metals suitable for electrodeposition, such as, but not limited to, copper, silver, gold, nickel, cobalt, or tungsten. Techniques other than electroplating may be employed to form the conductive layer. In some embodiments, conductive layer 502 is deposited by electroless deposition. In some embodiments, conductive layer 502 is deposited by chemical vapor deposition.

Figure 5F:
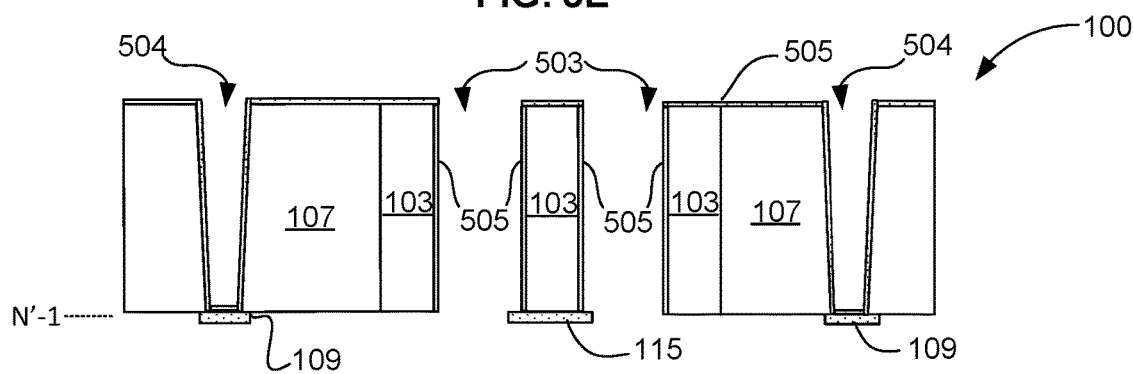

In the operation shown in FIG. 5F, via through-holes 503 and 504 are formed in magnetic core block 103 and package substrate core 107, respectively. Via-through-holes 503 are formed in magnetic core block 103 in preparation for formation of PTH inductors (e.g., inductors 102). Via through-holes 504 formed in package substrate core 107 are to receive through-vias 108. Via through-holes 503 and 504 are formed by mechanical or laser drilling methods, as described for cavity 501, according to some embodiments. In some embodiments, dry or wet etching techniques are used to make holes 503 and 504. Dry and wet etching methods may require lithographically-defined masks. Drilling methods may have a greater degree of dimensional control over etch methods, as mask undercutting may occur, which tends to enlarge etched regions and form sloped sidewalls. Mechanical drilling methods employ precision bits that form cylindrical holes with vertical sidewalls, as well as precise hole diameters. Laser drilling methods generally form holes having a conical profile.

In some embodiments, via through-holes 503, in which PTH inductors 102 are to be formed, have diameters ranging between 200 and 500 microns, depending on desired inductance, dc and ac resistance values. In some embodiments, the depth of via through-holes 503 ranges between 400 and 800 microns, or the z-height of package substrate core 107. The self-inductance of PTH inductors 102 to be plated in holes 503 may be determined by hole diameter and depth. The former and latter relate to inductor diameter and length.

Also shown in FIG. 5F, subsequent to the formation of via through-holes 503 and 504, conductive seed layer 505 is deposited over the surfaces of package substrate core 107, magnetic core block 103 and within via through-holes 503 and 504. In some embodiments, deposition of conductive seed layer 505 is performed to prepare surfaces for electrodeposition of conductive structures, including sidewalls of PTH inductors 102 (e.g., PTH sidewalls 105). In some embodiments, electroless deposition is the method for plating of conductive seed layer 505. Other suitable deposition processes may include vacuum evaporation, dc or rf sputtering, and chemical vapor deposition. Electroless deposition methods permit unobstructed deposition of conductive seed layer 505 within through-holes 503 and 504, covering sidewalls with a conductive surface. Coverage of hole sidewalls using vacuum deposition methods may be incomplete due to shadowing effects. Bottoms of through-holes 504 may be covered by lower traces and/or pads 109, which by themselves are conductive structures. Seed layer 505 may extend over these structures. In some embodiments, conductive seed layer 505 may have a thickness ranging between 50 nm to 2 microns. In some embodiments, conductive seed layer 505 may comprise a suitable metal film comprising any of copper, nickel, gold, silver, tungsten or molybdenum.

Figure 5G:
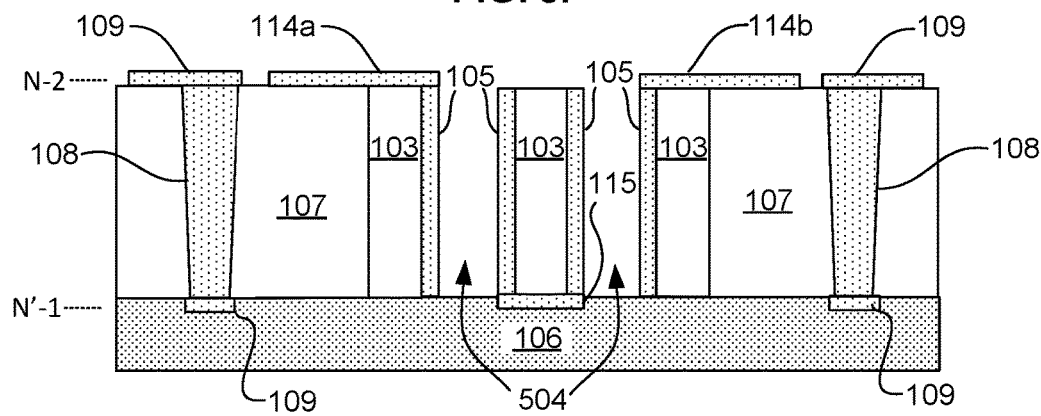

In the operation shown in FIG. 5G, through-vias 108 are formed by electroplating plugs of metal (e.g., copper) into through-holes 504. Through-vias 108 may fill through-holes 504 as via growth occurs from the bottom as well as the sidewalls, forming a solid plug of metal within through-holes 504. This is contrasted to growth of PTH sidewalls 105a and 105b, formed simultaneously in through-holes 503 within magnetic core block 103.

Growth of PTH sidewalls 105 only occurs from the sidewalls of through-holes 503. PTH sidewalls 105 form a conductive sleeve around the interior of via through holes 504. Deposition conditions may be adjusted to prepare the electroplated layer to a desired thickness. In some embodiments, PTH sidewalls 105 have a thickness that ranges between 5 and 100 microns.

Formation of die-side conductive layer N−2 may also be achieved in the electroplating operation. Conductive layer N−2 (shown in the patterned state), is formed over seed layer 505 over magnetic core block 103, sidewalls of through-holes 504 and package substrate core 107. Seed layer 505 is not shown in FIG. 5G as the conductive layer N−2 and sidewalls 105 are generally many times thicker than the underlying seed layer. The deposition of conductive layer N−2 may occur simultaneously with formation of through-vias 108 and PTH sidewalls 105. In general, through-vias 108 grow vertically (z-direction) within through-holes 504 and reach the die-side surface of package substrate core 107, merging with conductive layer N−2. As a consequence of the growth process, through-vias 108 are metallurgically contiguous with conductive layer N−2 as through-vias 108 extend laterally over adjacent conductive layer N−2 once through-holes 504 are filled. Accordingly, PTH sidewalls 105 are metallurgically contiguous with conductive layer N−2 as growth of PTH sidewalls 105 generally occurs simultaneously with growth of conductive layer N−2 over seed layer 505. According to embodiments, seed layer 505 forms as a contiguous layer over surfaces of package substrate core 107 and through-holes 504 made therein.

Conductive structures including traces 109 and traces 114 may be formed by lithographic methods, including etching of the conductive layer N−2 through an etch mask having lithographically-defined features. The etch mask may be a patterned photoresist layer over conductive layer N−2. Etching may be performed by wet or dry methods.

As a consequence of the formation of conductive layer N−2 described above, traces 109 are metallurgically contiguous with through-vias 108, according to some embodiments. Traces 114a and 114b are metallurgically contiguous with PTH sidewalls 105 as a consequence of the simultaneous growth of PTH sidewalls 105 with conductive layer N−2. On the land side of package substrate core 107, seed layer 505 extends to the bottom of through-holes 504 (see FIG. 5F), contacting trace 115 that extend into through-holes 504. During formation of conductive layer N−2, PTH sidewalls 105 may simultaneously grow over trace 115 and merge therewith. In some embodiments, traces 109, 114a and 114b, have a thickness that ranges between 12 to 25 microns.

FIG. 5G also shows addition of a layer of dielectric 106 on the land-side of package substrate core 107. In some embodiments, dielectric 106 is a dielectric package build-up film used for microelectronics package fabrication. Composition of dielectric 106 is described above. In some embodiments, dielectric 106 is deposited by lamination methods. Addition of the laminate comprising dielectric 106 embeds conductive layer N'−1 structures, including traces 109 and 115. In subsequent operations, openings (not shown) are made in the land-side layer of dielectric 106 over land side pad/traces 109 to extend interlayer vias (shown in FIG. 5I) to land-side bond pads (e.g., bond pads 119).

Figure 5H:
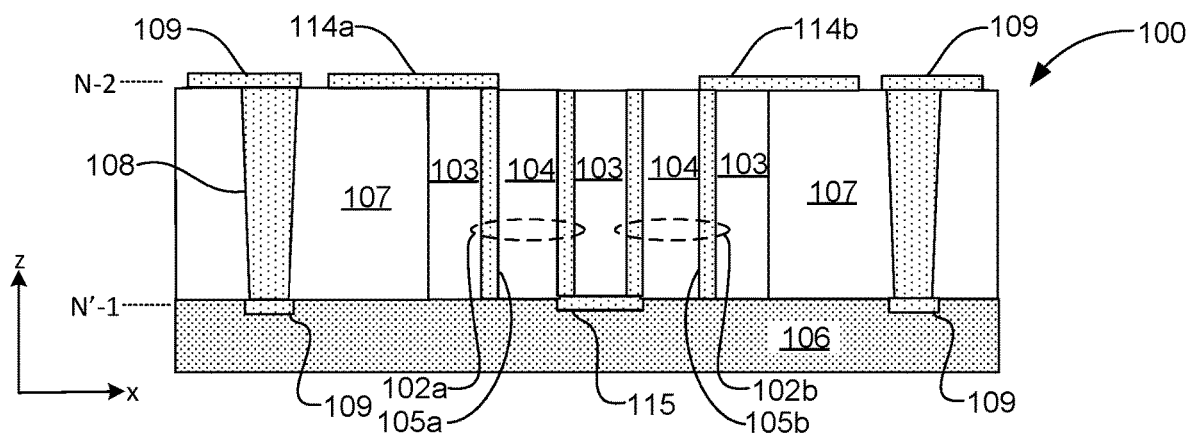

In the operation shown in FIG. 5H, remaining space within through-holes 504 are backfilled with PTH dielectric plugs 104, completing formation of PTH inductors 102. The completed PTH inductors 102 are indicated with encircling dashed ovals. PTH dielectric plugs 104 may be deposited as a liquid material that fills via through-holes 504, and then cured to form a solid material. In some embodiments, PTH dielectric plugs 104 comprises the same material comprised by dielectric 106. In some embodiments, PTH dielectric plugs 104 comprises an inorganic material such as, but not limited to, a silicate-based glass, a composite polymer and inorganic glass fill such as a fiberglass or a polycrystalline ceramic material. Deposition of PTH dielectric plugs 104 may employ a lithographically-defined mask to cover surfaces of IC package substrate 100 where deposition is not desired.

Figure 5I:
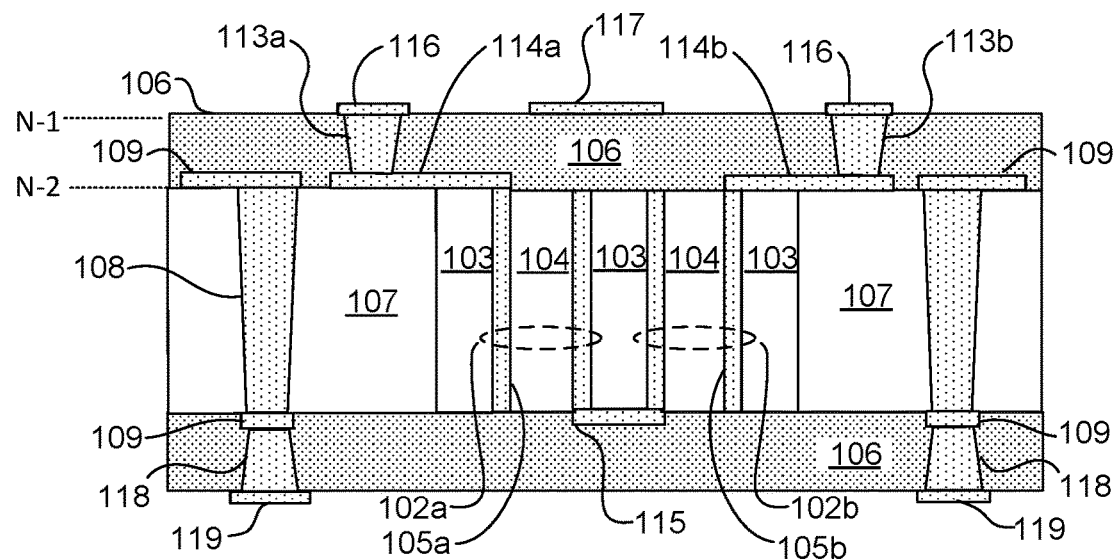

In the operation shown in FIG. 5I, a second layer of dielectric 106 is overlaid on the die side of package substrate core 107, embedding conductive layer N−2. In some embodiments, dielectric 106 is a dielectric film laminate as described above. Interlayer vias 113 and 118 are formed within openings made in the upper and lower dielectric layers 106, respectively. In some embodiments, openings for interlayer vias 113 and 118 have been made in a previous laser drilling operation, not shown. Traces 109 and 114 on both sides of package substrate core 107 may serve as laser stops, preventing damage to the material below. In some embodiments, interlayer vias 113 and 118 are formed by electroplating a suitable material comprising a metal, such as, but not limited to, copper, nickel, silver, gold, molybdenum, and tungsten into openings prepared in the upper and lower layers of dielectric 106.

In some embodiments, the same electroplating process for plating through-vias 108 and PTH sidewalls 105 may be employed to electroplate interlayer vias 113 and 118 on the die side and land side of package substrate core 107. In some embodiments, a seed layer (e.g., seed layer 505; not shown) is deposited in a previous operation. Conductive layers N−1 on the die side and N' on the land side are formed simultaneously by deposition of a suitable metal, including, but not limited to, copper, over the seed layer. The growth of conductive layers N' and N−1 may occur simultaneously with formation of interlayer vias 113 and 118. The growth process may occur according to the mechanism described above for conductive layer N−2 through-vias 108 and PTH sidewalls 105.

Conductive layers N−1 and N' may be patterned by lithographic methods as described above for the patterning of conductive layer N−2. In the illustrated embodiment, conductive layer N−1 patterned structures include pads/traces 116 and 117. Conductive layer N' patterned structures include bond pads 119.

Figure 5J:
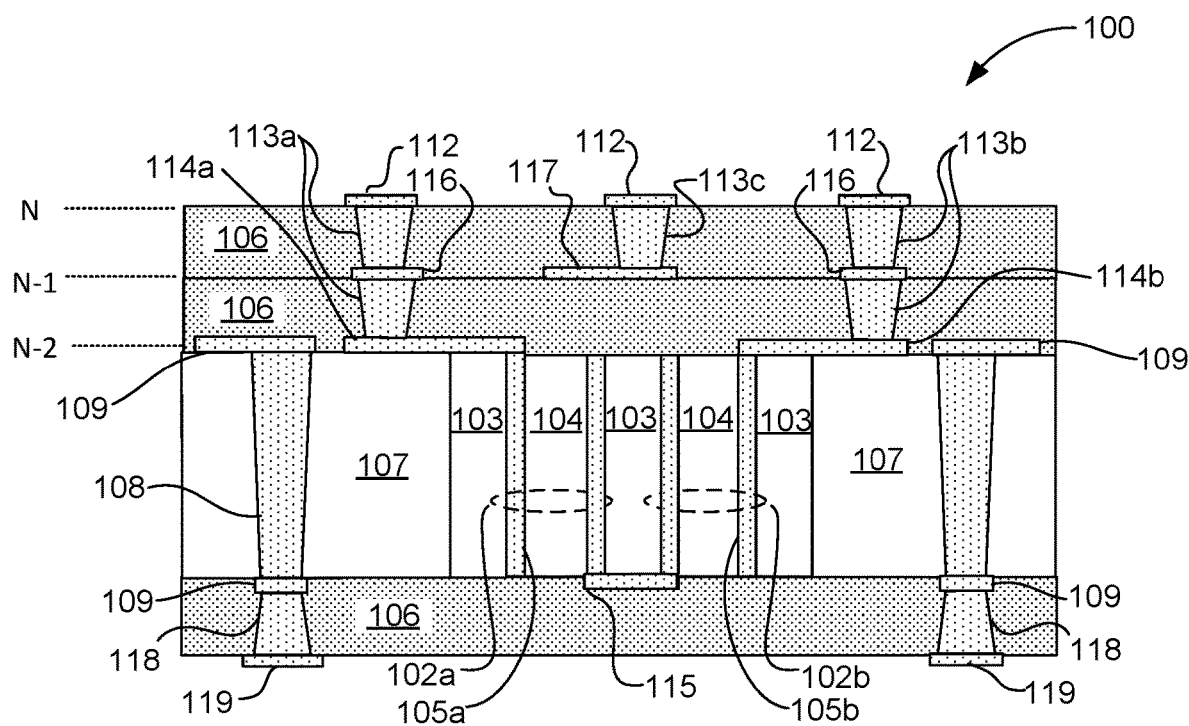

In the operation shown in FIG. 5J, a third layer of dielectric 106 is laminated over the second layer of dielectric 106 on the die side of package substrate 100, covering conductive layer N−1 and embedding patterned structures therein. After the third dielectric film layer 106 is deposited, openings may be drilled (e.g., by laser ablation or drilling) for via formation. Interlayer vias 113a, 113b and 113c are formed by electrodeposition into openings that have been formed in dielectric 106 in the previous operation. Interlayer vias 113 in the third layer of dielectric 106 are stacked over interlayer vias 113 formed in the second layer of dielectric 106. The stacked vias form a vertical interconnect for integrated inductor unit 101.

In some embodiments, conductive layer N is formed as a sheet over the third layer of dielectric 106 simultaneously with growth of interlayer vias 113a-c. A seed layer may be deposited over the third layer of dielectric 106 in a previous operation. First-level die-side bond pads 112 (e.g., FLI pads) are patterned from conductive level N by lithographic methods, as described above. In alternate embodiments, bond pads 112 are formed over the third layer of dielectric 106 by pad plating, where a seed layer over the surface dielectric 106 has not been provided. A general growth mechanism of pad plating, overgrowth of interlayer vias 113 form islands that extend laterally from the tops of interlayer vias 113 over the surface of dielectric 106. The size of bond pads 112 may be chosen by controlling deposition conditions.

In the illustrated embodiment, the formation of package substrate 100 is complete.

Figure 5K:
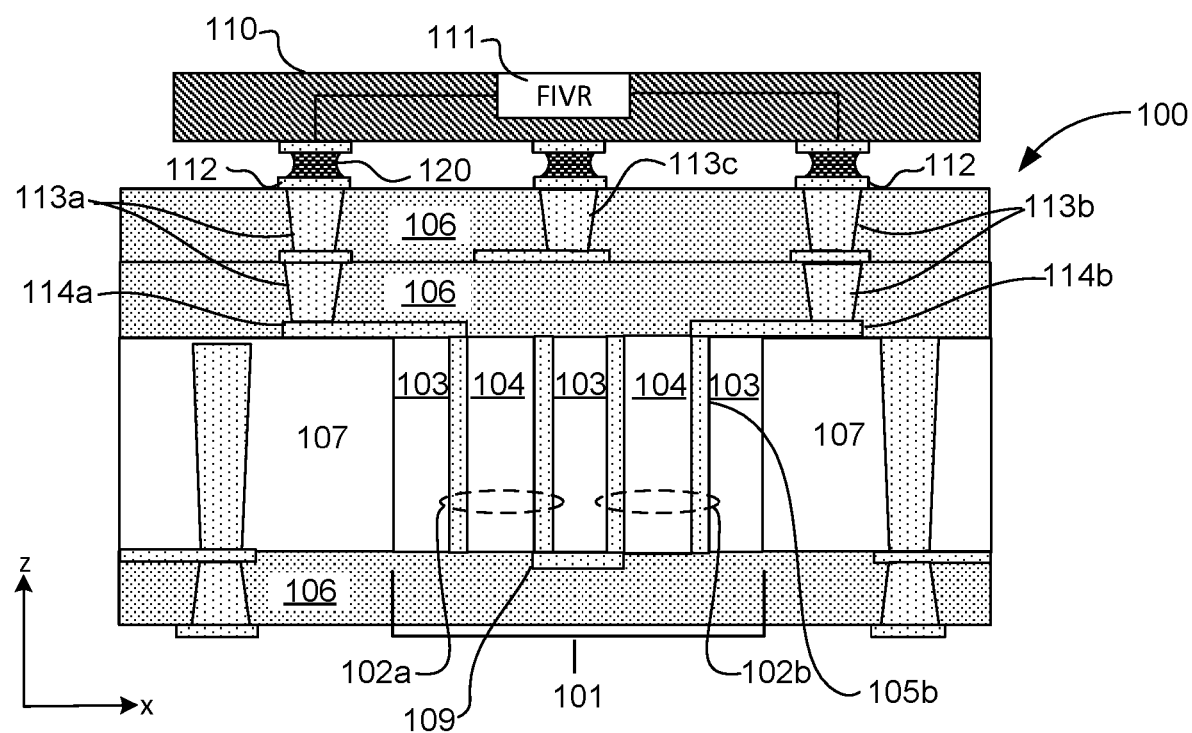

In the operation shown in FIG. 5K, die 110 is attached to package substrate 100. Die attach methods such as flip-chip bonding may be employed, where solder joints 120 are formed to bond die 110 to FLI bond pads (e.g., bond pads 112) package substrate 100. In flip-chip bonding, a ball grid array (BGA) on die 110 is aligned to bond pads 112 on package substrate 100 and reflowed to create solder joints 120.

Figure 6:
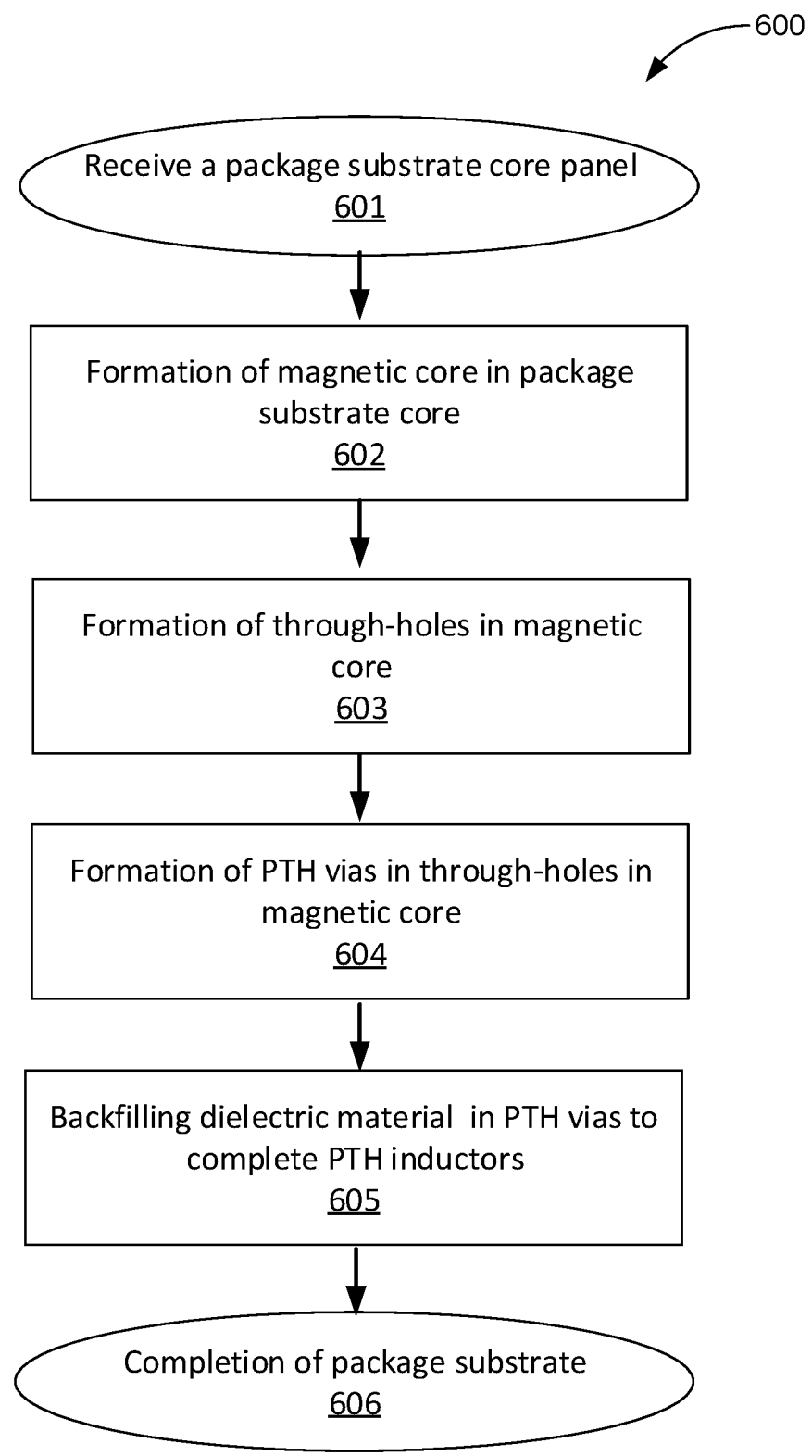
FIG. 6 illustrates a flow chart summarizing the exemplary method illustrated in FIGS. 5A-5K, according to some embodiments of the disclosure.

FIG. 6 illustrates flow chart 600 summarizing the exemplary method illustrated in FIGS. 5A-5K, according to some embodiments of the disclosure.

In operation 601, a package core panel is prepared for formation of via holes and trench excavation for formation of a magnetic core (e.g. magnetic core block 103). The package core panel may comprise a dielectric material such as, but not limited to, fiberglass-reinforced epoxy resins, glass, or polymer-ceramic composites. The package core panel provides a rigid mechanical support for the fabrication of a cored BBUL package substrate (e.g., package substrate 100), formed by lamination of dielectric layers and of metallization structures as described above. When the build-up process is complete, the processed package core panel may be diced into individual cored package substrates (e.g., package substrate 100). Each individual cored package substrate comprises a package substrate core (e.g., package substrate core 107) that is cut from the package core panel.

In operation 602, formation of magnetic core (e.g., magnetic core block 103) in the package substrate core is performed. In some embodiments, openings are formed in the package substrate core by laser drilling or mechanical drilling methods. Dry etching methods may be employed. After formation, cavities are filled by a magnetic core precursor material. In some embodiments, the magnetic material is printed into the cavities in a liquid or semi-liquid state. In some embodiments, the magnetic material comprises a polymer precursor that hardens upon curing. Curing may be performed by a thermal treatment or by photocuring.

In the exemplary method, a conductive layer (e.g., conductive layer 502, FIG. 5D) is formed on one side of the package core panel. A conductive seed layer is deposited over a surface of the package core panel. In some embodiments, the surface is on the land side of the package core panel. The conductive seed layer forms an electrode over which a thick conductive layer is electroplated. In some embodiments, the conductive layer comprises copper. In some embodiments, the conductive layer is patterned into conductive structures (e.g., pads 109 and traces 115). The patterning may be performed by a through-mask etch process, where an etch mask is made by lithographically defining features in a photomask, followed by a wet or dry etch step.

In operation 603, via through-holes are formed in package substrate core and magnetic cores. In some embodiments, via through-holes are formed by laser or mechanical drilling. Via trough-holes (e.g., via through-holes 503 and 504) are made in the magnetic core and the package substrate core, respectively. Via through-holes 503 in the magnetic core are to be plated through-holes for the PTH inductors. The diameter of via through-holes 503 in the magnetic core may be adjusted for specified inductances of the PTH inductors, as the inductance of the PTH inductors is a function of the diameter of the PTH via and thickness of the plated sidewalls (e.g., PTH sidewalls 105).

Formation of via through-holes may be followed by deposition of a conductive seed layer (e.g., conductive seed layer 505, FIG. 5F). The conductive seed layer may serve as a galvanic plating electrode (cathode) for electroplating a thick conductive layer in a subsequent operation.

In operation 604, through-vias (e.g., through-vias 108, FIG. 5G) are electroplated into via through-holes (e.g., via through-holes 504, FIG. 5F). PTH sidewalls 105 may be formed simultaneously in via through-holes (e.g., via through-holes 503, FIG. 5G) in the magnetic core, forming PTH inductors (e.g., PTH inductors 102, FIG. 5H). In the exemplary method, an electroplated conductive layer is formed over the portion of seed layer covering the die-side package core surface. From the die-side conductive layer, conductive structures (e.g., traces 109 and 114, FIG. 5F-5G) are formed over the package core panel by through-mask wet or dry etching methods.

In some embodiments, land-side and die-side conductive structures are formed simultaneously after formation of via through holes (e.g., via through-holes 503 and 504). A conductive seed layer may be deposited over both sides of the package core panel after via through holes are made. Electroplating of conductive layers on both sides of the package core panel may be performed over the seed layer.

In the exemplary method, a layer of dielectric build-up film (e.g., dielectric 106, FIG. 5G) is laminated over the land side of the package core panel. In some embodiments, the lamination of build-up film layer of dielectric 106 precedes filling openings within PTH sidewalls 105 with dielectric plugs.

In operation 605, dielectric plugs (e.g., dielectric plugs 104, FIG. 5H) are formed in the PTH inductors, where the openings within PTH sidewalls 105 are filled with a dielectric material (e.g., dielectric plugs 104, FIG. 5H). In some embodiments, formation of PTH inductors (e.g., PTH inductors 102, FIG. 5H) is completed at this step.

In operation 606, one or more layers of dielectric build-up film is laminated on the die side of the package core panel (e.g., layers of dielectric 106 on the die side of package substrate core 107, FIGS. 5I and 5J) to complete the formation of package substrate 100. Vias on the die side (e.g., interlayer vias 113, FIGS. 5I and 5J) are formed within the dielectric layer(s) by formation of openings (e.g., by laser drilling) over lower conductive structures (e.g., traces 114 formed on package core panel, FIG. 5I), then electroplating metal (e.g., copper) into the openings. The conductive structure (e.g., traces 114, FIG. 5I, and traces 116, FIG. 5J) at the bottom of the opening may be coupled to a power supply to enable electroplating into the openings.

Similarly, on the land side of the package core panel, vias (e.g., vias 118, FIG. 5I) are formed in the layer of dielectric build-up film on the land side of the package core panel. In some embodiments, land-side vias 118 interconnect conductive structures on the land-side surface of package core panel (e.g., traces 109, FIG. 5I) with land-side bond pads (e.g., bond pads 111, FIG. 5I).

The build-up process to form the multi-layer build-up package (e.g., package substrate 100) may continue with lamination of additional layers of dielectric build-up film on the die side, land side or both sides of the package core panel. In the exemplary method, a second layer of dielectric build-up film is laminated over the die side of the package core panel as the final layer. The metallization process is repeated, forming vias (e.g., interlayer vias 113, FIG. 5J) terminating in bond pads (e.g., bond pads 112, FIG. 5J) on the die side of the completed package substrate.

The package core panel may then be diced to liberate the individual cored package substrates (e.g., package substrate 100).

Figure 7:
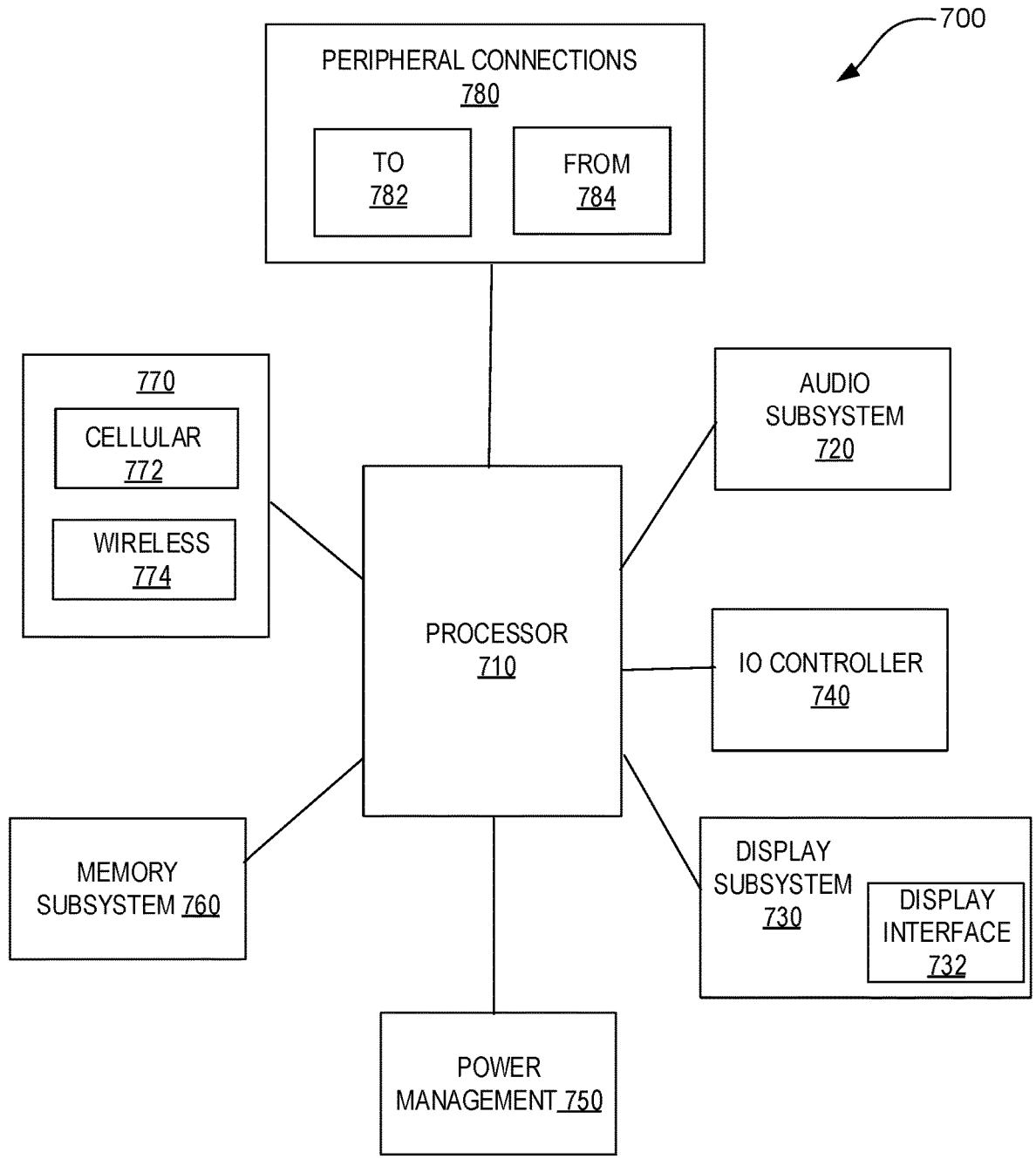
FIG. 7 illustrates a block diagram of an IC package having integrated inductors, fabricated according to the disclosed method, as part of a system-on-chip (SoC) package in an implementation of computing device, according to some embodiments of the disclosure.

FIG. 7 illustrates a block diagram of a package having integrated inductors, fabricated according to the disclosed method, as part of a system-on-chip (SoC) package in an implementation of computing device, according to some embodiments of the disclosure.

In FIG. 7, a block diagram is shown of an embodiment of a mobile device in which integrated inductors could be used. In some embodiments, computing device 700 represents a mobile computing device, such as a computing tablet, a mobile phone or smart-phone, a wireless-enabled e-reader, or other wireless mobile device. It will be understood that certain components are shown generally, and not all components of such a device are shown in computing device 700.

In some embodiments, computing device 700 includes a first processor 710 that comprises at least one FIVR. The various embodiments of the present disclosure may also comprise a network interface within 770 such as a wireless interface so that a system embodiment may be incorporated into a wireless device, for example, cell phone or personal digital assistant.

In one embodiment, processor 710 can include one or more physical devices, such as microprocessors, application processors, microcontrollers, programmable logic devices, or other processing means. The processing operations performed by processor 710 include the execution of an operating platform or operating system on which applications and/or device functions are executed. The processing operations include operations related to I/O (input/output) with a human user or with other devices, operations related to power management, and/or operations related to connecting the computing device 700 to another device. The processing operations may also include operations related to audio I/O and/or display I/O.

In one embodiment, computing device 700 includes audio subsystem 720, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 700, or connected to the computing device 700. In one embodiment, a user interacts with the computing device 700 by providing audio commands that are received and processed by processor 710.

Display subsystem 730 represents hardware (e.g., display devices) and software (e.g., drivers) components that provide a visual and/or tactile display for a user to interact with the computing device 700. Display subsystem 730 includes display interface 732 which includes the particular screen or hardware device used to provide a display to a user. In one embodiment, display interface 732 includes logic separate from processor 710 to perform at least some processing related to the display. In one embodiment, display subsystem 730 includes a touch screen (or touch pad) device that provides both output and input to a user.

I/O controller 740 represents hardware devices and software components related to interaction with a user. I/O controller 740 is operable to manage hardware that is part of audio subsystem 720 and/or display subsystem 730. Additionally, I/O controller 740 illustrates a connection point for additional devices that connect to computing device 700 through which a user might interact with the system. For example, devices that can be attached to the computing device 700 might include microphone devices, speaker or stereo systems, video systems or other display devices, keyboard or keypad devices, or other I/O devices for use with specific applications such as card readers or other devices.

As mentioned above, I/O controller 740 can interact with audio subsystem 720 and/or display subsystem 730. For example, input through a microphone or other audio device can provide input or commands for one or more applications or functions of the computing device 700. Additionally, audio output can be provided instead of, or in addition to display output. In another example, if display subsystem 730 includes a touch screen, the display device also acts as an input device, which can be at least partially managed by I/O controller 740. There can also be additional buttons or switches on the computing device 700 to provide I/O functions managed by I/O controller 740.

In one embodiment, I/O controller 740 manages devices such as accelerometers, cameras, light sensors or other environmental sensors, or other hardware that can be included in the computing device 700. The input can be part of direct user interaction, as well as providing environmental input to the system to influence its operations (such as filtering for noise, adjusting displays for brightness detection, applying a flash for a camera, or other features).

In one embodiment, computing device 700 includes power management 750 that manages battery power usage, charging of the battery, and features related to power saving operation. Memory subsystem 760 includes memory devices for storing information in computing device 700. Memory can include nonvolatile (state does not change if power to the memory device is interrupted) and/or volatile (state is indeterminate if power to the memory device is interrupted) memory devices. Memory subsystem 760 can store application data, user data, music, photos, documents, or other data, as well as system data (whether long-term or temporary) related to the execution of the applications and functions of the computing device 700.

Elements of embodiments are also provided as a machine-readable medium (e.g., memory 760) for storing the computer-executable instructions. The machine-readable medium (e.g., memory 760) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity via network interface 770 includes hardware devices (e.g., wireless and/or wired connectors and communication hardware) and software components (e.g., drivers, protocol stacks) to enable the computing device 700 to communicate with external devices. The computing device 700 could be separate devices, such as other computing devices, wireless access points or base stations, as well as peripherals such as headsets, printers, or other devices.

Network interface 770 can include multiple different types of connectivity. To generalize, the computing device 700 is illustrated with cellular connectivity 772 and wireless connectivity 774. Cellular connectivity 772 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 774 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 780 include hardware interfaces and connectors, as well as software components (e.g., drivers, protocol stacks) to make peripheral connections. It will be understood that the computing device 700 could both be a peripheral device ("to" 782) to other computing devices, as well as have peripheral devices ("from" 784) connected to it. The computing device 700 commonly has a "docking" connector to connect to other computing devices for purposes such as managing (e.g., downloading and/or uploading, changing, synchronizing) content on computing device 700. Additionally, a docking connector can allow computing device 700 to connect to certain peripherals that allow the computing device 700 to control content output, for example, to audiovisual or other systems.

In addition to a proprietary docking connector or other proprietary connection hardware, the computing device 700 can make peripheral connections 780 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. A microelectronics package, comprising:
   a substrate comprising a body of magnetic material embedded within a dielectric material between two conductive layers;
   a first inductor structure within a first via in the body of magnetic material, wherein the first via extends between the two conductive layers, wherein the first inductor structure comprises a conductive material along a sidewall of the first via and electrically coupled to the two conductive layers, and wherein the conductive material is in contact with the magnetic material and substantially surrounds a dielectric material that is within the first via; and
   a second inductor structure within a second via in the same body of magnetic material as the first via, wherein the second via extends between the two conductive layers, wherein the second inductor structure comprises the conductive material along a sidewall of the second via and electrically coupled to the two conductive layers, and wherein the conductive material is in contact with the magnetic material and substantially surrounds a dielectric material that is within the second via.

2. The microelectronics package of claim 1, wherein:
   the body of magnetic material extends between the first and second vias.

3. The microelectronics package of claim 2, wherein the first inductor structure is electrically coupled in series to the second inductor structure through one of the two conductive layers.

4. The microelectronics package of claim 2, wherein the first inductor structure is electrically coupled in parallel to the second inductor structure through a first of the two conductive layers and through a second of the two conductive layers.

5. The microelectronics package of claim 2, wherein the magnetic material comprises magnetic particles embedded within a dielectric material.

6. The microelectronics package of claim 5, wherein the first and second vias are two vias comprising two inductor turns in an array of vias that are all within the same body of magnetic material, and wherein the array of vias have a constant pitch in at least one direction within the array and comprising additional inductor turns.

7. The microelectronics package of claim 6, wherein the array is a two-dimensional array having a first pitch in a first direction and a second pitch a second direction, substantially orthogonal to the first direction.

8. The microelectronics package of claim 5, wherein the magnetic particles comprise any of iron, nickel, cobalt, manganese, samarium, ytterbium, gadolinium, terbium, or dysprosium.

9. The microelectronics package of claim 5, wherein the magnetic particles are embedded in one of an epoxy resin or an acrylic resin.

10. The microelectronics package of claim 1, wherein the dielectric material within the first via and within the second via comprises an epoxy resin or an acrylic resin.

11. The microelectronics package of claim 1, wherein an integrated circuit die is electrically coupled to the first and second inductor structures.

12. The microelectronics package of claim 11, wherein the die comprises at least one of a voltage regulator circuit, an oscillator circuit or a filter circuit coupled to the first or second vias.

13. A system, comprising:
a microelectronics package comprising:
- a substrate comprising at least two conductive layers separated by a first dielectric material, wherein a body of magnetic material is embedded within the first dielectric material between the two conductive layers; and
- a first inductor structure within a first through-hole in the body of magnetic material, wherein the first through-hole extends between the two conductive layers, wherein the first inductor structure comprises a conductive material along a sidewall of the first through-hole and electrically coupled to the two conductive layers, and wherein the conductive material is in contact with the magnetic material and substantially surrounds a second dielectric material within the first through-hole;
- a second inductor structure within a second through-hole in the same body of magnetic material as the first through-hole, wherein the second through-hole extends between the two conductive layers, wherein the second inductor structure comprises the conductive material along a sidewall of the second through-hole and electrically coupled to the two conductive layers, and wherein the conductive material is in contact with the magnetic material and substantially surrounds the second dielectric material within the second through-hole; and
- a die coupled to at least one of the at least two conductive layers of the substrate, wherein the die comprises a power management circuit coupled to the first and second inductor structures, and wherein the power management circuit is coupled to receive an electrical input from a power supply.

14. The system of claim 13, wherein the power management circuit is an integrated voltage regulator circuit coupled to the first and second inductor structures.

15. The system of claim 13, wherein the die comprises a radio frequency (RF) circuit coupled to the first and second inductor structures, and wherein the RF circuit is any one of a RF oscillator circuit, a RF amplifier circuit or a RF mixer circuit.

16. A microelectronics package, comprising;
- two conductive layers separated by a substrate core;
- a body of magnetic material adjacent to the substrate core;
- a first inductor structure within a first via extending through the body of magnetic material; and
- a second inductor structure within a second via extending through the same body of magnetic material as the first via, wherein:
  - a conductive material electrically coupled to the two conductive layers is within the first and second vias and in contact with the magnetic material; and
  - a dielectric material is within the first and second vias and in contact with the conductive material.

17. The microelectronics package of claim 16, wherein the first inductor structure is electrically coupled in series to the second inductor structure by a first of the two conductive layers.

18. The microelectronics package of claim 16, wherein the first inductor structure is electrically coupled in parallel to the second inductor structure by a first of the two conductive layers.

19. The microelectronics package of claim 16, wherein a first surface of the magnetic material is substantially coplanar with a first surface of the substrate core, and wherein a first of the two conductive layers is over the first surface of the magnetic material and over the first surface of the substrate core.

20. The microelectronics package of claim 19, wherein a second surface of the magnetic material is substantially coplanar with a second surface of the substrate core, and wherein a second of the two conductive layers is over the second surface of the magnetic material and the second surface of the substrate core.

* * * * *